(12) United States Patent
Kochi et al.

(10) Patent No.: US 6,946,637 B2
(45) Date of Patent: Sep. 20, 2005

(54) IMAGE SENSING DEVICE USING MOS TYPE IMAGE SENSING ELEMENTS

(75) Inventors: Tetsunobu Kochi, Kanagawa-ken (JP); Shigetoshi Sugawa, Kanagawa-ken (JP); Isamu Ueno, Kanagawa-ken (JP); Katsuhisa Ogawa, Tokyo (JP); Toru Koizumi, Kanagawa-ken (JP); Katsuhito Sakurai, Tokyo (JP); Hiroki Hiyama, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/680,181

(22) Filed: Oct. 8, 2003

(65) Prior Publication Data

US 2004/0065808 A1 Apr. 8, 2004

Related U.S. Application Data

(62) Division of application No. 09/161,402, filed on Sep. 28, 1998, now Pat. No. 6,670,990.

(30) Foreign Application Priority Data

Sep. 29, 1997 (JP) .............................................. 9-263545
Dec. 26, 1997 (JP) .............................................. 9-361089

(51) Int. Cl.[7] .............................................. H01J 40/14
(52) U.S. Cl. .................................... 250/208.1; 348/313
(58) Field of Search ........................ 250/208.1, 214 D; 257/292; 348/310

(56) References Cited

U.S. PATENT DOCUMENTS

| | | | |
|---|---|---|---|
| 4,751,559 A | 6/1988 | Sugawa et al. ................ 357/30 |
| 4,810,896 A | 3/1989 | Tanaka et al. ............... 250/578 |
| 4,814,846 A | 3/1989 | Matsumoto et al. .......... 357/30 |
| 4,866,293 A | 9/1989 | Nakamura et al. .......... 250/578 |
| 4,962,412 A | 10/1990 | Shinohara et al. ............. 357/30 |
| 5,283,428 A | 2/1994 | Morishita et al. ........ 250/214.1 |
| 5,453,611 A | 9/1995 | Oozu et al. ............... 250/208.1 |
| 5,539,461 A | 7/1996 | Andoh et al. ................ 348/308 |
| 5,698,892 A | 12/1997 | Koizumi et al. ............. 257/620 |
| 5,723,877 A | 3/1998 | Sugawa et al. ................ 257/59 |
| 5,780,858 A | 7/1998 | Waechter .................. 250/208.1 |
| 5,801,373 A | 9/1998 | Oozu et al. ............... 250/208.1 |
| 5,869,857 A | 2/1999 | Chen .......................... 257/292 |
| 6,043,525 A | 3/2000 | Chen .......................... 257/292 |
| 6,064,431 A | 5/2000 | Ueno ......................... 348/241 |
| 6,414,292 B1 | 7/2002 | Afghahi .................... 250/208.1 |

FOREIGN PATENT DOCUMENTS

| | | |
|---|---|---|
| CN | 1 193 174 A | 9/1998 |
| EP | 0928101 | 7/1999 |
| JP | 01 292856 A | 11/1989 |

*Primary Examiner*—David Porta
*Assistant Examiner*—Tony Ko
(74) *Attorney, Agent, or Firm*—Fitzpatrick, Cella, Harper & Scinto

(57) ABSTRACT

In a photoelectric conversion device having a plurality of pixel cells each of which includes a photoelectric conversion element, a field effect transistor having the gate area for storing signal charge generated by the photoelectric conversion element and the source-drain path for outputting a signal corresponding to the signal charge stored in the gate, a first power supply line for supplying electric power to the field effect transistor, and a first switch connected between the field effect transistor and the first power supply line, when a reset voltage for resetting the gate of the field effect transistor is $V_{sig0}$, a threshold voltage of the field effect transistor is $V_{th}$, current flowing through the field effect transistor is $I_a$, a voltage applied via the first power supply line is $V_{c1}$, and a series resistance of the first switch is $R_{on}$, each pixel cell is configured to satisfy a condition determined by $V_{c1} - R_{on} \times I_a > V_{sig0} - V_{th}$.

11 Claims, 20 Drawing Sheets

IMAGE SENSING DEVICE USING MOS TYPE IMAGE SENSING ELEMENTS

This application is a divisional of application Ser. No. 09/161,402, filed Sep. 28, 1998 now U.S. Pat. No. 6,670,990.

BACKGROUND OF THE INVENTION

The present invention relates to a photoelectric conversion device having a plurality of photoelectric conversion elements and, more particularly, to a photoelectric conversion device capable of improving linearity of the photoelectric conversion, further, widening a dynamic range by utilizing characteristics of transistors used for outputting signals corresponding to charges generated by photoelectric conversion elements and characteristics of metal-oxide semiconductor (MOS) transistor switches, thereby improving signal/noise (S/N) ratio.

Conventionally, in a solid-state image sensing device, charge-coupled-device (CCD) type photoelectric conversion elements are used in most cases; however, MOS type photoelectric conversion elements have been recently developed for commercial products. It has been said that a MOS type photoelectric conversion device provide an image of inferior quality compared to an image sensed by a CCD type photoelectric conversion device. However, if noise is reduced, there are advantages in the MOS type photoelectric conversion device in that it is possible to drive the MOS type photoelectric conversion device by the same power source with lower energy compared to the CCD type photoelectric conversion device, and photo-receiving unit and its peripheral circuits are manufactured in the same MOS manufacturing processes, thus it is easier to integrate the photo-receiving unit and the peripheral circuits. Accordingly, these merits of the MOS type photoelectric conversion device start attracting attentions recently. Currently, it is possible to reduce random noise and fixed noise for improving quality of an image provided by the MOS type photoelectric conversion device, and there is a new demand for widening the dynamic range of each MOS type photoelectric conversion element in order to obtain image signals of a higher S/N ratio.

Note, in the following explanation, a MOS type a photoelectric conversion element and a MOS type photoelectric conversion device are simply referred to as a photoelectric conversion element and a photoelectric conversion device.

FIG. 1 is a circuit diagram illustrating a brief configuration of a conventional photoelectric conversion device. In FIG. 1, photoelectric conversion elements 1 (e.g., photodiodes), arranged in two dimensions, generate charges corresponding to the received quantity of light. In FIG. 1, only 16 (=4×4) photoelectric conversion elements are shown for the sake of illustrative convenience, however, a large number of photoelectric conversion elements are usually used in practice. One end of each photoelectric conversion element is connected to the gate of a MOS transistor 2; the drain of the MOS transistor 2 is connected to the source of a MOS transistor 3 which configures a row selection switch, and the source of the MOS transistor 2 is connected to a constant current source 7 via a vertical output line 6; and the drain of each MOS transistor 3 is connected to a power supply terminal 5 via a power supply line 4. The foregoing elements collectively form the source follower. Reference 14 denotes a MOS transistor configuring a reset switch, and its source is connected to the gate of the MOS transistor 2 and its drain is connected to the power supply terminal 5 via the power supply line 4.

In this circuit, a signal corresponding to the gate voltage of the MOS transistor 2 which changes depending upon charge generated by the photoelectric conversion element 1 of each pixel, is amplified and outputted by the source follower which performs current amplification.

The gate of each MOS transistor 3 is connected to a vertical scanning circuit 9 via a vertical gate line 8. The gate of each reset switch 14 is also connected to the vertical scanning circuit 9 via a reset gate line 15. Further, an output signal from the source follower is outputted via the vertical output line 6, a MOS transistor 10 which configures a switch for horizontal transference, a horizontal output line 11, and an output amplifier 12. The gate of each MOS transistor 10 is connected to a horizontal scanning circuit 13.

An operation of this circuit is as follows. First, the photoelectric conversion elements 1 are reset by the reset switches 14, thereafter, charges are stored. Note, since the photoelectric conversion elements 1 generate electrons depending upon the amount of light received, the gates of the MOS transistor 2 are charged to a reset potential during the reset operation, and the potentials at the gates of the MOS transistors 2 drop in response to the generation of the electrons. Accordingly, a potential corresponding to the generated charges appears at the gate of each MOS transistor 2. After the charging period is over, a signal of a pixel selected by the vertical scanning circuit 9 and the horizontal scanning circuit 13 is amplified by the source follower, and outputted via the output amplifier 12.

In the above configuration, since the source follower and the reset switch 14 share the same power supply line 4, it is possible to down-size the circuit.

Further, by arranging the row selection switch 3 on the side of the power supply with respect to the MOS transistor 2, impedance of the selection switch 3 does not exist between the source of the MOS transistor 2 and the constant current source 7; accordingly, an output of good linearity is obtained from the source follower.

Below, output characteristics of the source follower as described above is explained.

In order to simplify the explanation, one photoelectric conversion element 1 and its peripheral circuit corresponding to a single pixel are shown in FIG. 2. In FIG. 2, the same elements as those shown in FIG. 1 are referred to by the same reference numerals. Generally, for the source follower to operate linearly, i.e., to output a voltage in proportion to an input voltage, a MOS transistor, forming the source follower, needs to operate in the saturation region; thus, the following condition should be satisfied.

$$V_{ds} > V_{gs} - V_{th} \tag{1}$$

where $V_{ds}$ is the voltage difference between the drain and the source, $V_{gs}$ is the voltage difference between the gate and the source, and $V_{th}$ is a threshold voltage.

In a case of the source follower having a configuration as shown in FIG. 2, let the ON-state impedance of the row selection switch 3 be $R_{on}$, and current flowing through the source follower be $I_a$, then the drain voltage of the MOS transistor 2 is $$\text{Power supply voltage} - R_{on} \times I_a \tag{2}$$

due to a voltage drop in the row selection switch 3. Accordingly, $V_{ds}$ in the equation (1) decreases, thereby a region for the source follower to operate linearly (called "linear operation region" hereinafter) is narrowed. As a result, the source follower does not operate within the linear operation region for every voltage, applied to the gate of the MOS 2, which depends upon the charge generated by the photoelectric conversion element 1, and the following two problems arise:

(a) Input-output linearity in low luminosity region deteriorates.

(b) Saturation voltage becomes small, thus the dynamic range is narrowed.

Further, when the current flowing through the source follower is reduced in order to reduce the voltage drop in the row selection switch 3, it takes considerable time to charge a capacitance with a small current. Accordingly, it takes a considerable time to transfer signals, thus the number of pixels in the photoelectric conversion device is limited when charges should be transferred in a predetermined period. Consequently, the conventional circuit is not suitable for operating a great number of pixels.

Another example of a conventional photoelectric conversion device is explained below.

FIG. 3 is a circuit diagram illustrating a brief configuration of a conventional CMOS area sensor. In FIG. 3, a two-dimensional area sensor having 2×2 pixels is shown, however, the number of pixels is not limited to this.

The circuit corresponding to each pixel of the area sensor shown in FIG. 3 is explained. In each pixel, a photodiode 901, a MOS transistor 911 as a transfer switch, a MOS transistor 902 as a reset switch, a MOS transistor 903 as an amplifier, and a MOS transistor 904 as a row selection switch are provided. The gate of the transfer switch 911 is connected to a line which is driven by a signal ΦTX(n, n+1) by a vertical scanning circuit 910, the gate of the reset switch 902 is connected to a line which is driven by a signal ΦRES(n, n+1) by the vertical scanning circuit 910, and the gate of the row selection switch 904 is connected to a line which is driven by a signal ΦSEL(n, n+1) by the vertical scanning circuit 910.

Photoelectric conversion is performed in each photodiode 901, and while generating the photo-charge, the transfer switch 911 is in the OFF state and the photo-charge is not transferred to the gate of the amplifier 903. The gate of the MOS transistor 903 is initialized to a predetermined voltage by turning on the reset switch 902 before the photo-charge is transferred. The predetermined voltage is a dark level. Thereafter or at the same time, the row selection switch 904 is turned on, and the source follower, configured with a constant current source 905 and the amplifier (MOS transistor) 903, starts operating. After or at the same time the row selection switch 904 is turned on, the transfer switch 911 is turned on, thereby the charge generated by the photodiode 901 is transferred to the gate of the amplifier 903.

Accordingly, outputs of the selected row are transferred to vertical output lines 906. The outputs are then stored in a signal storage unit 907 via MOS transistors 909a and 909b which work as transfer gates. The outputs, temporarily stored in the signal storage unit 907, are sequentially outputted as $V_O$ under control of a horizontal scanning circuit 908.

FIG. 4 is a timing chart for operating the CMOS area sensor shown in FIG. 3. During a period T1, signals ΦTX(n) and ΦTX(n+1) become active, and charges generated by the photodiodes 901 of all the pixels are transferred to the gates of the MOS transistors 903 via the transfer switches 911, thereby the photodiodes 901 are reset. In this state, a part of the charges in the cathodes of the photodiodes 901 are transferred to the gates of the MOS transistors 903 and the voltages of the cathodes and the gates become the same level. By using the capacitor CFD 913 of a large capacitance connected to the gate of the MOS transistor 903, potential of the MOS transistor 903 becomes the same level as that of the cathode of the photodiode 901 when it is reset.

During the period T1, a mechanical shutter (not shown) is open for letting in light from an object; therefore, right after the period T1 is over, a charging process starts in every pixel simultaneously. The mechanical shutter is kept open during a period T3, and this period is a charging period of the photodiodes 901.

After the period T3 is over, the mechanical shutter closes at time T4, thereby the charging process of the photodiodes 901 completes. In this state, photo-charges are stored in the photodiodes 901. Next, the stored photo-charges start being read by row.

First, during a period T5, the signal ΦSEL(n) becomes active, thereby the row selection switches 904 in the n-th row are turned on. In this state, the source followers, each of which includes the MOS transistor 903 of the pixel in the n-th row, become active. Then, the signal ΦRES(n) becomes active in a period T2, and the reset switches 902 in the n-th row are turned on, thereby the gates of the MOS transistors 903 are initialized. Accordingly, signals of dark level are outputted to the vertical output lines 906.

Next, the signal ΦTN(n) becomes active, and the transfer gates 909b are turned on, and the signals of dark level are stored in the signal storage unit 907. The aforesaid operation is simultaneously performed for all the pixels in the n-th row. When finishing transferring the signals of dark level to the signal storage unit 907, the signal ΦTX(n) becomes active, and the transfer switches 911 in the n-th row are turned on. Accordingly, the photo-charges stored in the photodiodes 901 in the n-th row are transferred to the gates of the MOS transistors 903. At this time, potential at the gate of each MOS transistor 903 changes from the dark level, or the reset level, by an amount of the transferred charge, and a signal of a level corresponding to the changed potential is outputted to the vertical output line 906.

Then, the signal ΦTS becomes active, the transfer gates 909a are turned on, and the signals on the vertical output lines 906 (the levels of these signals are referred to as "signal level" hereinafter) are stored in the signal storage unit 907. This operation is simultaneously performed for all the pixels in the n-th row. In this state, the signal storage unit 907 stores the dark levels and the signal levels of all the pixels in the n-th row, thus, by taking the difference between the dark level and the signal level of each pixel, fixed pattern noise caused by variation in threshold voltage Vth between the MOS transistors 903 and thermal noise (KTC noise) generated when resetting the MOS transistors 903 by the reset switches 902 are canceled. Accordingly, it is possible to obtain high S/N signals from which noise components are reduced.

Then, the difference signals, stored in the signal storage unit 907, between the dark levels and the signal levels are read out horizontally under control of the horizontal scanning circuit 908 during the period T7 time-serially. Thus, the output operation of the signals in the n-th row is completed.

Similarly, by driving signals ΦSEL(n+1), ΦRES(n+1), ΦTX(n+1), ΦTX(n+1), ΦTN, and ΦTS in the same manner as those for the n-th row, signals in the (n+1)-th row are read out.

In the above conventional example, since the differences between the dark-levels and the signal levels are outputted, a high S/N ratio is realized, thereby high-quality image signals are obtained. Further, the solid state image sensing elements of the above configuration are formed in processes of forming CMOS transistors, therefore, it is possible to integrate the image sensing elements and the peripheral circuits on one chip. Accordingly, manufacturing cost is reduced and high performance is realized.

However, although the noise components are reduced, if the dynamic range of an element for reading photo-charge is narrow, the S/N ratio can not be further improved.

As for an input dynamic range of the element for reading photo-charge, from a graph shown in FIG. 5, the maximum input level, $V_G(FD)_{max}$, is, $$V_G(FD)_{max} = V_G(RES) - V_{th}(RES) \quad (3)$$

where $V_G(RES)$ is the potential at the gate of the reset switch 902, and $V_{th}(RES)$ is the threshold voltage of the reset switch 902. Thus, the maximum input level $V_G(FD)_{max}$ is the difference between the signal level $\Phi RES(n)$, applied to the gate of the reset switch 902, and the threshold voltage between the gate and source of the reset switch 902. Further, the minimum input level, $V_G(FD)_{min}$, is, $$V_G(FD)_{min} = V_G(TX) - V_{th}(TX) \quad (4)$$

where $V_G(TX)$ is the potential at the gate of the transfer switch 911, and $V_{th}(TX)$ is the threshold voltage of the transfer switch 911. Thus, the minimum input level $V_G(FD)_{min}$ is the difference between the signal level $\Phi TX(n)$, applied at the gate of the reset switch 911, and a threshold voltage between the gate and source of the transfer switch 911.

Accordingly, the input dynamic range, Dy, is, $$\begin{aligned} Dy &= V_G(FD)_{max} - V_G(FD)_{min} \\ &= V_G(RES) - V_G(TX) + V_{th}(TX) - V_{th}(RES) \end{aligned} \quad (5)$$

In equation (5) of the input dynamic range Dy, $V_{th}(TX)$ and $V_{th}(RES)$ of the MOS transistors differ, one from the other, since there are variations in the manufactured MOS transistors. This makes the input dynamic range Dy unstable.

The photoelectric conversion device will be applied to devices which require a higher resolution (more pixels) and lower energy consumption (lower voltage), such as a digital still camera and a video camcorder, in the future. However, the conventional circuit can not meet the aforesaid demands of high resolution (more pixels), which causes an increase in driving load, and of low energy consumption (lower voltage), which causes deterioration of dynamic range.

SUMMARY OF THE INVENTION

The present invention has been made in consideration of the above situation, and has as its object to provide a photoelectric conversion device having good input-output linearity.

According to the present invention, the foregoing object is attained by providing a photoelectric conversion device having a plurality of pixel cells each of which includes a photoelectric conversion element, a field effect transistor having the gate area for storing signal charge generated by the photoelectric conversion element and the source-drain path for outputting a signal corresponding to the signal charge stored in the gate, a first power supply line for supplying electric power to the field effect transistor, and a first switch connected between the field effect transistor and the first power supply line, the device is characterized in that, when a reset voltage for resetting the gate of the field effect transistor is $V_{sig0}$, a threshold voltage of the field effect transistor is $V_{th}$, current flowing through the field effect transistor is $I_a$, a voltage applied via the first power supply line is $V_{c1}$, and a series resistance of the first switch is $R_{on}$, each pixel cell satisfies a condition determined by $V_{c1} - R_{on} \times I_a > V_{sig0} - V_{th}$.

It is another object of the present invention to provide a photoelectric conversion device capable of realizing good input-output linearity as well as widening dynamic range.

According to the present invention, the foregoing object is attained by providing the above photoelectric conversion device in which each of the pixel cells further comprises a second switch for resetting the gate area of the field effect transistor, and the first switch and the second switch are field effect transistors having different threshold voltages from each other.

According to the present invention, the foregoing object is also attained by providing a photoelectric conversion device having a plurality of pixel cells each of which includes a photoelectric conversion element, a first switch for transferring charge generated by the photoelectric conversion element, a field effect transistor, having the gate area for receiving the transferred charge, for outputting a signal corresponding to the charge stored in the gate area, and a second switch for resetting the gate area of the field effect transistor, the device is characterized in that threshold voltages of the first switch and the second are made different from a threshold voltage of the field effect transistor.

Further, it is another object of the present invention to reduce a variation in dynamic range in addition to the foregoing objects.

According to the present invention, the foregoing object is attained by providing the aforesaid photoelectric conversion device in which the threshold voltage of the field effect transistor for outputting a signal is made different from the threshold voltages of the first switch and the second switch by doping all the channel regions of the field effect transistor for outputting a signal, the first switch, and the second switch with dopant of a predetermined impurity concentration, first, then further doping a channel region of the field effect transistor for outputting a signal.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail in accordance with the accompanying drawings.

Figure 1:
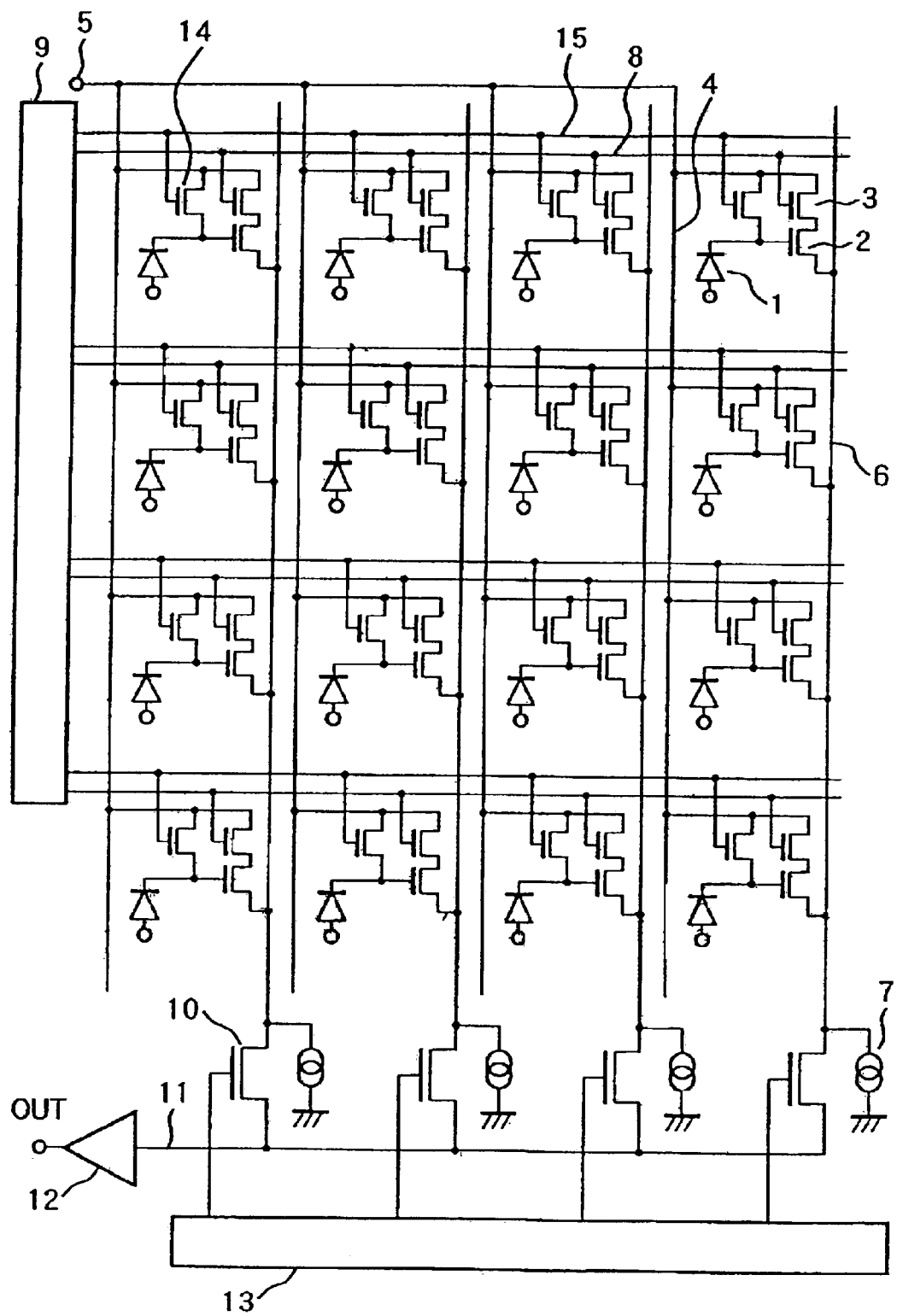
FIG. 1 is a circuit diagram illustrating a brief configuration of a conventional photoelectric conversion device.
Figure 2:
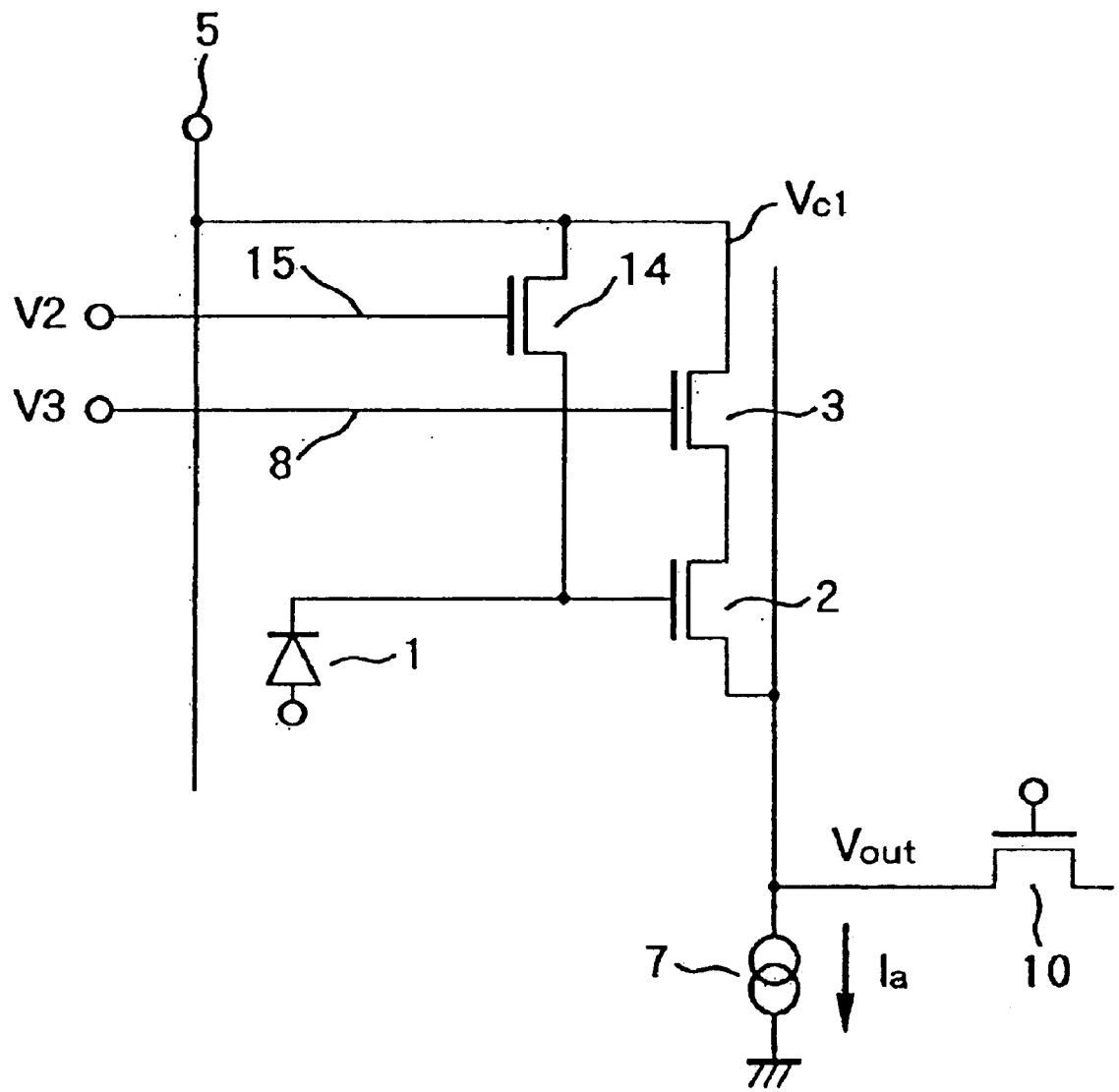
FIG. 2 is a circuit diagram illustrating a photoelectric conversion element and its peripheral circuit corresponding to a single pixel of the conventional photoelectric conversion device shown in FIG. 1.

The overall configuration of a photoelectric conversion device according to first to eighth embodiments of the present invention is the same as shown in FIG. 1. However, characteristics of the MOS transistors 3 and 14 of the present invention are different from those of conventional ones. Therefore, the MOS transistors, corresponding to the conventional MOS transistors 2, 3 and 14, are referred to by 102, 103 and 114, respectively, in the present invention.

<First Embodiment>

Figure 6:
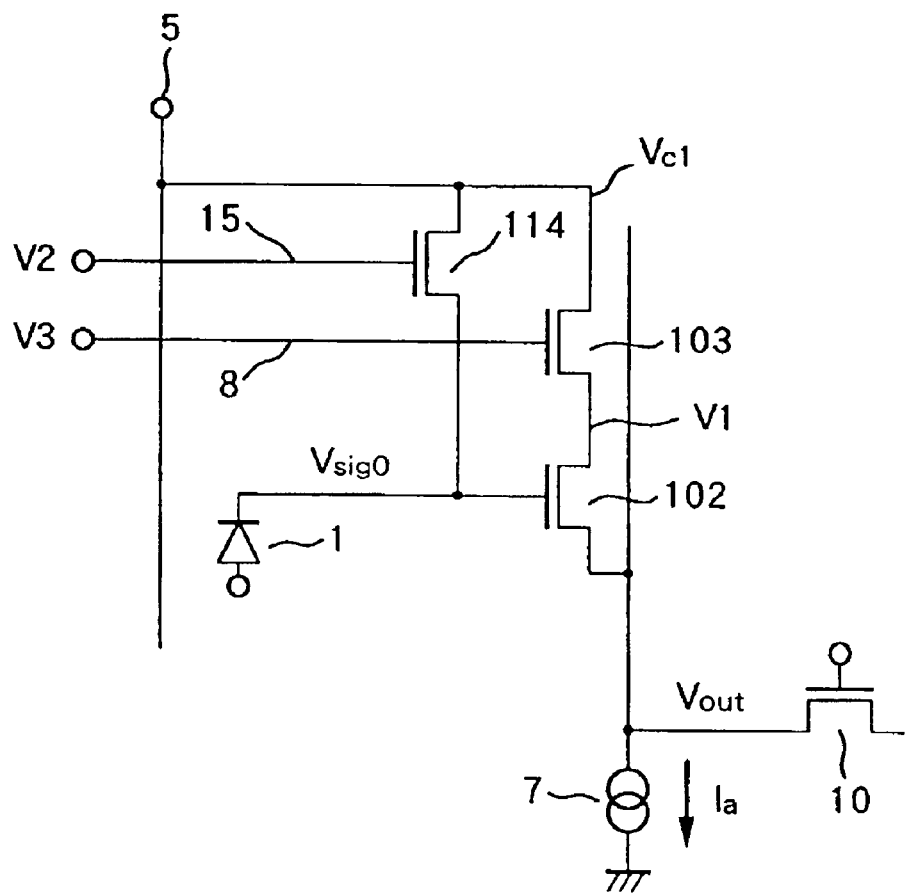
FIG. 6 is a circuit diagram showing one photoelectric conversion element and its peripheral circuit corresponding to a single pixel according to a first embodiment of the present invention.

FIG. 6 is a circuit diagram showing one photoelectric conversion element 1 and its peripheral circuit corresponding to a single pixel according to the first embodiment of the present invention. In FIG. 6, the MOS transistor 103 which acts as a row selection switch is a field effect transistor (FET). Let the gate voltage of the reset switch 114 when it is on be V2, the gate voltage of the row selection switch 103 when it is on be V3, the drain voltage of the MOS transistor 102 be V1, a threshold voltage of the reset switch 114 be $V_{th0}$, a threshold voltage of the row selection switch 103 be Vth1, and a threshold voltage of the MOS transistor 102 be $V_{th2}$. Note, the source follower is formed with the MOS transistors 102 and 103 and the constant current source 7.

As explained in the "Background of the Invention", when the source follower operates in the linear operation region, the condition of the MOS transistors 103 and 102 to operate in the saturation region, $$V_{ds} > V_{gs} - V_{th} \qquad (1)$$

is satisfied. The conventional source follower does not always operate in the region where the above equation (1) holds. Therefore, in the present invention, the photoelectric conversion device is designed so that a MOS transistor of the source follower always satisfies the equation (1). In the first embodiment, a condition of designing the source follower so as to satisfy the equation (1) is explained.

Referring to FIG. 6 in the first embodiment, when the source voltage of the MOS transistor 102 is considered as a reference voltage, $V_{ds}$ in the equation (1) is V1, $V_{gs}$ is the gate voltage of the MOS transistor 102, and $V_{th}$ is $V_{th2}$. when an ON-state impedance of the MOS transistor 103 is expressed by $R_{on}$, then, V1 is expressed as, $$V1 = V_{c1} - R_{on} \times I_a \qquad (6)$$

By plugging the equation (6) into the equation (1), it becomes, $$V_{c1} - R_{on} \times I_a > V_{gs} - V_{th2} \qquad (7)$$

In the photoelectric conversion device of the present invention, the gate of the MOS transistor 102 is initially charged to a reset voltage, $V_{sig0}$, and the voltage drops in response to electrons generated by the photoelectric conversion element 1 in correspondence with the amount of light. Therefore, in order for the source follower to always operate in the linear operation region, the MOS transistors 102, 103 and 114 are to be designed to operate in the saturation region when the reset voltage $V_{sig0}$ is applied to the gate of the MOS transistor 102, namely, when $V_{gs} = V_{sig0}$.

Note, when relationship between an input signal $V_{in}$ (gate voltage of the MOS transistor 102) and output signal $V_{out}$ (output signal of the source follower) is expressed by $$V_{out} = A \times V_{in}^{\gamma} \qquad (8)$$

where A is a gain and γ is a parameter value, input-output linearity of the source follower is defined by how much the value of γ deviates from 1.

Figure 16:
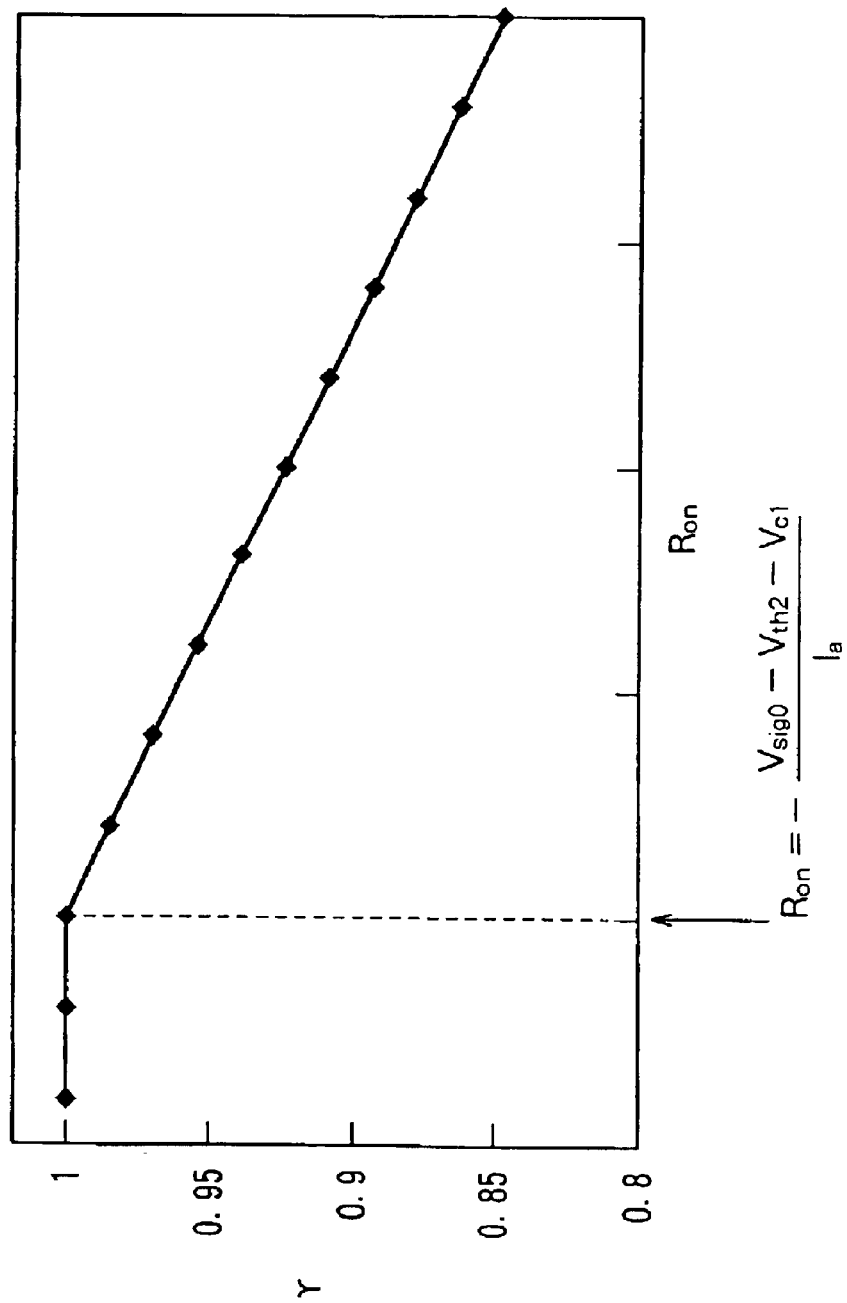
FIG. 16 is a graph showing input-output linearity.

FIG. 16 is a graph showing improvement of the input-output linearity according to the present invention as described in the first to eighth embodiments. In FIG. 16, the abscissa shows an ON-state impedance of the row selection switch 103, and the ordinate shows γ value. As shown in FIG. 16, it is known that the input-output linearity of the source follower is secured in the region where the equation (7) holds.

In the first embodiment, in a case where the reset switch 114 operates in the saturation region, the reset voltage $V_{sig0}$ is expressed by the following equation (9), $$V_{sig0} = V2 - V_{th0} \qquad (9)$$

Next, since the ON-state impedance $R_{on}$ of the row selection switch 103 changes depending upon its threshold voltage $V_{th1}$, the left-hand side of the equation (7) is expressed using $V_{th1}$. Considering that current flowing through the row selection switch 103 is the same as the current flowing through the source follower, the following equation is obtained.

$$I_a = K(V3-V1-V_{th1})^2 \quad (10)$$

where $K=1/2 \times \mu \times C_{ox} \times W/L$
$\mu$: Mobility
$C_{ox}$: Capacitance of gate oxide per unit area
W: Gate width
L: Gate length In the first embodiment, gradual channel approximation is used. By solving the equation (10) for V1, then, $$V1 = V3 - V_{th1} - (I_a/K)^{1/2} \quad (11)$$

By plugging the equations (9) and (11) into the equation (1), then a condition for the source follower to operate in the linear operation region, when the reset voltage $V_{sig0}$ is applied to the gate of the MOS transistor 102, is obtained. Namely, $$V3 - V_{th1} - (I_a/K)^{1/2} > V2 - V_{th0} - V_{th2} \quad (12)$$

Thus, the photoelectric conversion device is to be designed so as to satisfy the equation (12).

In the first embodiment, a case where the MOS transistors 102, 103 and 114 have an identical threshold voltage, when potentials of sources and wells are the same, is explained.

When all of the MOS transistors 102, 103 and 114 have the same threshold voltage, when potentials of sources and wells are the same, and the gate voltages V2 and V3 are the same voltage of a power supply (i.e., V2=V3=$V_{c1}$), the threshold voltage $V_{th0}$ of the reset switch 114 and the threshold voltage $V_{th1}$ of the row selection switch 103, when the reset voltage $V_{sig0}$ is applied to the gate of the MOS transistor 102, are the same. Accordingly, the equation (12) is simplified to, $$(I_a/K)^{1/2} < V_{th2} \quad (13)$$

In this case, the maximum current which may flow though the source follower is limited by the threshold voltage $V_{th2}$ of the MOS transistor 102, as seen from the equation (13).

The aforesaid explanation will be described more specifically using model values. Referring to FIG. 6, 5V is applied to the power supply terminal ($V_{c1}$=5V), and 5V is also applied to the gates of the reset switch 114 and the row selection switch 103 (V2=V3=5V), for instance. Further, when the thickness of gate oxide of each MOS transistor is about 15 nm, impurity concentration of well is $4 \times 10^{16}$ particles/cm$^3$, the threshold voltage, in a case where the potentials of the source and the well are the same, is 0.6V, considering an increase in threshold voltage due to backgate effect, the threshold voltages 0.6V of the reset switch 114 and the row selection switch 103 increase to 1.4V (=$V_{th0}$, $V_{th1}$). Under these conditions, the reset voltage $V_{sig0}$ determined by the characteristics of the reset switch 114 is obtained from the equation (9), and $$V_{sig0} = 5 - 1.4 = 3.6 \text{ [V]} \quad (14)$$

Next, according to the equation (11), the drain voltage V1 of the MOS transistor 102 is, $$V1 = 5 - 1.4 - (I_a/K)^{1/2} = 3.6 - (I_a/K)^{1/2} \quad (15)$$

Further, when the gate voltage $V_{sig0}$ is 3.6V, the threshold voltage $V_{th2}$ of the MOS transistor 102 is $$V_{th2} = 1.24 \text{ [V]} \quad (16)$$

By plugging the equations (15) and (16) into the equation (1), then, $$(I_a/K)^{1/2} < 1.24 \quad (17)$$

is obtained. This result coincides with the equation (13), and it is known that the current $I_a$ which may flow through the source follower is limited to an amount which satisfies the equation (13). Further, when $\mu = 400$ [cm$^2$/S·V]

Cox=$2.3 \times 10^{-7}$ [F/cm$^2$]

W=1 [$\mu$m]

L=1 [$\mu$m]

of a MOS transistor, then, $K = 4.6 \times 10^{-5}$ [A]

and $I_a = 7.5 \times 10^{-5}$ [A]

Therefore, when the MOS transistors having the aforesaid specification and characteristics are used, by setting the current $I_a$ generated by the constant current source 7 to $7.5 \times 10^{-5}$ A, the source follower always operates in the linear operation region.

According to the first embodiment as described above, by designing the source follower so that each MOS transistor satisfies the equation (1), it is possible to configure a photoelectric conversion device of good input-output linearity by using the source follower which always operates in the linear operation region.

<Second Embodiment>

In the second embodiment, a case where the MOS transistor 103 has a different threshold voltage from that of transistors 102 and 114 is explained.

As described in the first embodiment, when the MOS transistors 102, 103 and 104 have an identical threshold voltage, the current allowed to flow through the source follower is limited to a very low value. Therefore, when a higher resolution is demanded and a load that the source follower needs to drive increases, the configuration explained in the first embodiment can not meet the demand.

However, by setting the threshold voltage of the row selection switch 103 lower than those of the MOS transistors 102 and 114, it is possible to satisfy equation (12), or equation (1), while increasing the current $I_a$. When the voltages V2 and V3 applied to the gates of the reset switch 114 and the row selection switch 103 are the same (V2=V3), similarly to the first embodiment, by solving the equation (12) for $(Ia/K)^{1/2}$, then the condition $$(I_a/K)^{1/2} < V_{th0} + V_{th2} - V_{th1} \quad (18)$$

is obtained. Since $V_{th0} > V_{th1}$ and $V_{th2} > V_{th1}$, $V_{th0} + V_{th2} - V_{th1}$ is larger than $V_{th2}$ of the equation (13), i.e., $V_{th0} + V_{th2} - V_{th1} > V_{th2}$. Therefore, it is possible to set the current $I_a$ expressed by the equation (18) to a larger value than that expressed by the equation (13).

Note, the threshold voltages of the MOS transistors 114, 103 and 102 ($V_{th0}$, $V_{th1}$, $V_{th2}$) may be arbitrarily determined in accordance with the utilization purpose.

Several ways for changing the threshold voltage of a MOS transistor are explained below.

(1) Forming Doped Layer in Channel Region

Figure 7:
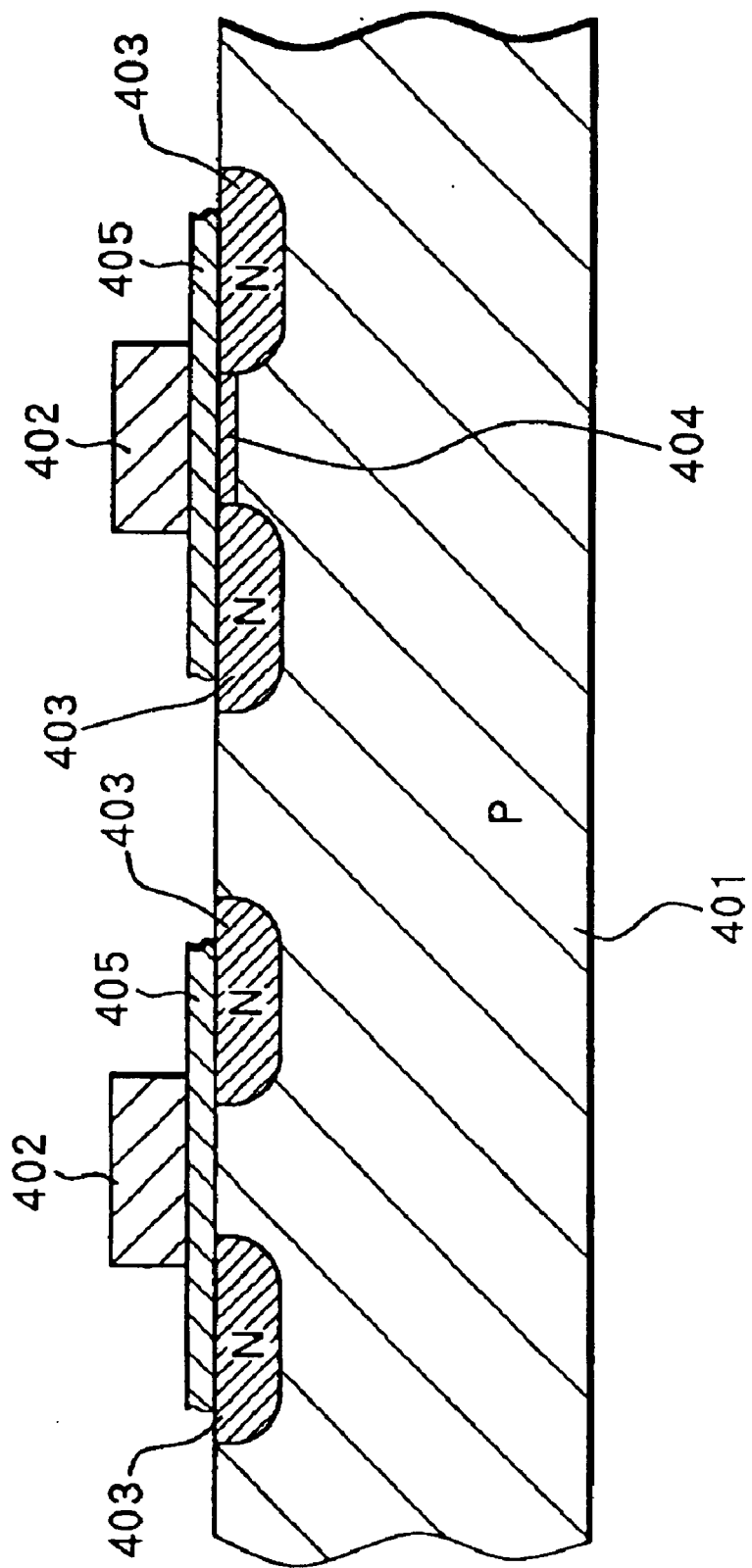
FIG. 7 is a cross-sectional view showing configurations of transistors according to a second embodiment of the present invention.

Referring to FIG. 7, reference numeral 401 denotes a semiconductor substrate, and in FIG. 7, it is a p type semiconductor. Further, reference 402 denotes gate electrodes formed on the semiconductor substrate 401 separated by gate oxide 405, and made of, e.g., polysilicon, polycide, and a laminated film thereof. Reference numeral 403 denotes source electrodes and drain electrodes of the opposite conductive type to the semiconductor substrate 401, formed by, e.g., ion implantation in the semiconductor substrate 401. The foregoing components configure field effect transistors (FET).

Then, by forming a doped layer 404 in the channel region of a desired transistor, it is possible to easily make a transistor having a threshold voltage different from other transistors. For instance, in FIG. 7, by doping n type ion to form the doped layer 404, it is possible to decrease the threshold voltage comparing to the one which does not have a doped layer. In contrast, by doping p type ion, it is possible to increase the threshold voltage. A change in threshold voltage can be precisely determined by controlling impurity concentration and depth of the doped layer 404.

Note, in this configuration, a doped layer is formed in one transistor. However, the present invention is not limited to this, and doped layers having different impurity concentrations, set to optimal conditions, may be formed in more than one transistors.

(2) Forming Well Region

Figure 8:
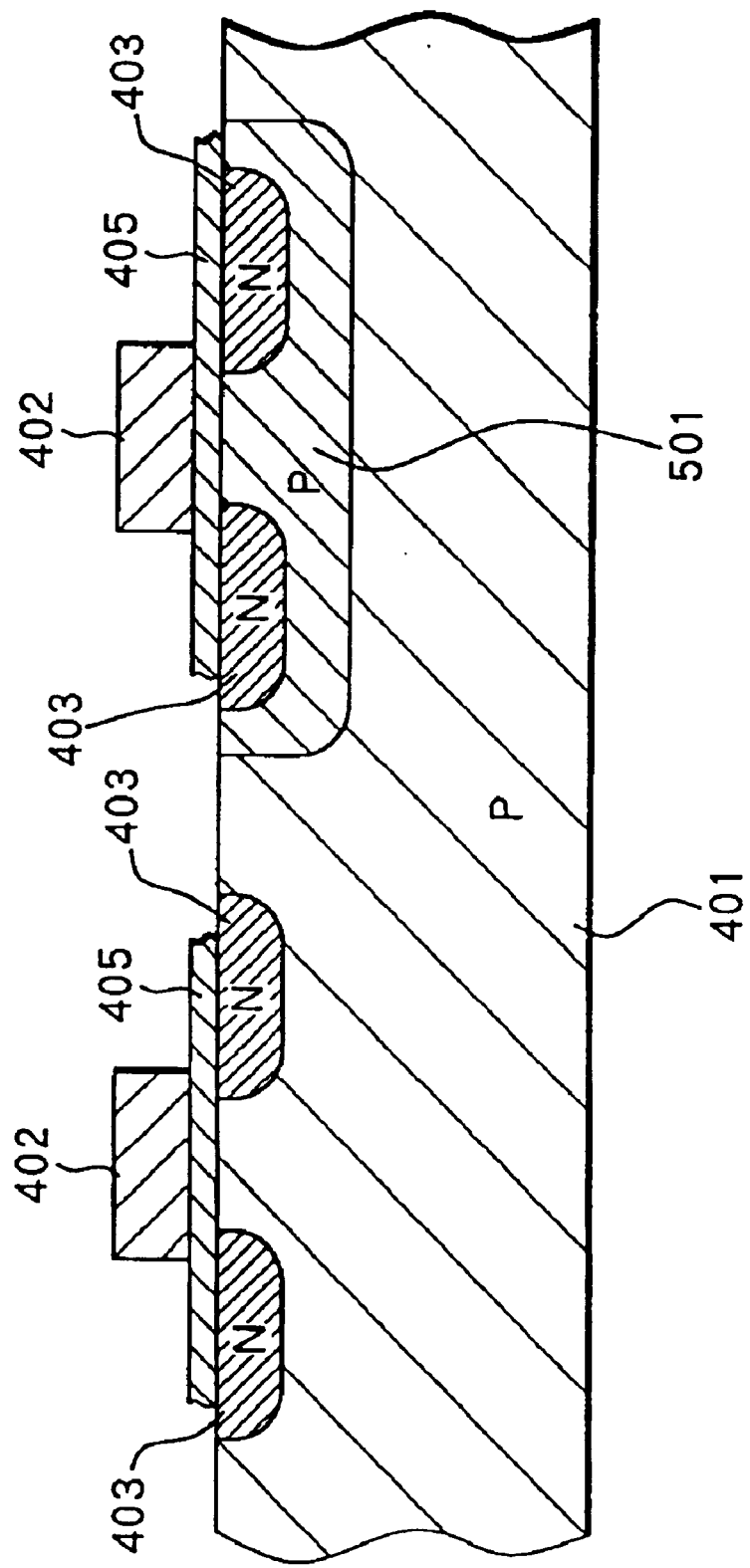
FIG. 8 is a cross-sectional view showing configurations of transistors according to the second embodiment of the present invention.

As another method for changing a threshold voltage, there is a method of configuring a transistor as shown in FIG. 8. Note, in FIG. 8, the same portions as those shown in FIG. 7 are referred to by the same reference numerals, and explanation of them are omitted.

In FIG. 8, reference numeral 501 denotes a well formed in a region where a desired transistor is formed. In FIG. 8, the impurity concentration of the p type well 501 is different from the impurity concentration of the semiconductor substrate 401 of the same p type. Thus, by forming the well 501 having a different impurity concentration from that of the semiconductor substrate 401, it is possible to easily control the threshold voltage of the desired transistor. Note, in FIG. 8, a case where a p type well is formed in a p type substrate, however, the present invention is not limited to this, and it is possible to form a plurality of p type wells having different impurity concentrations, controlled so as to obtain desired threshold voltages, in an n type substrate.

(3) Controlling Thickness of Dielectric Film at Gate

Figure 9:
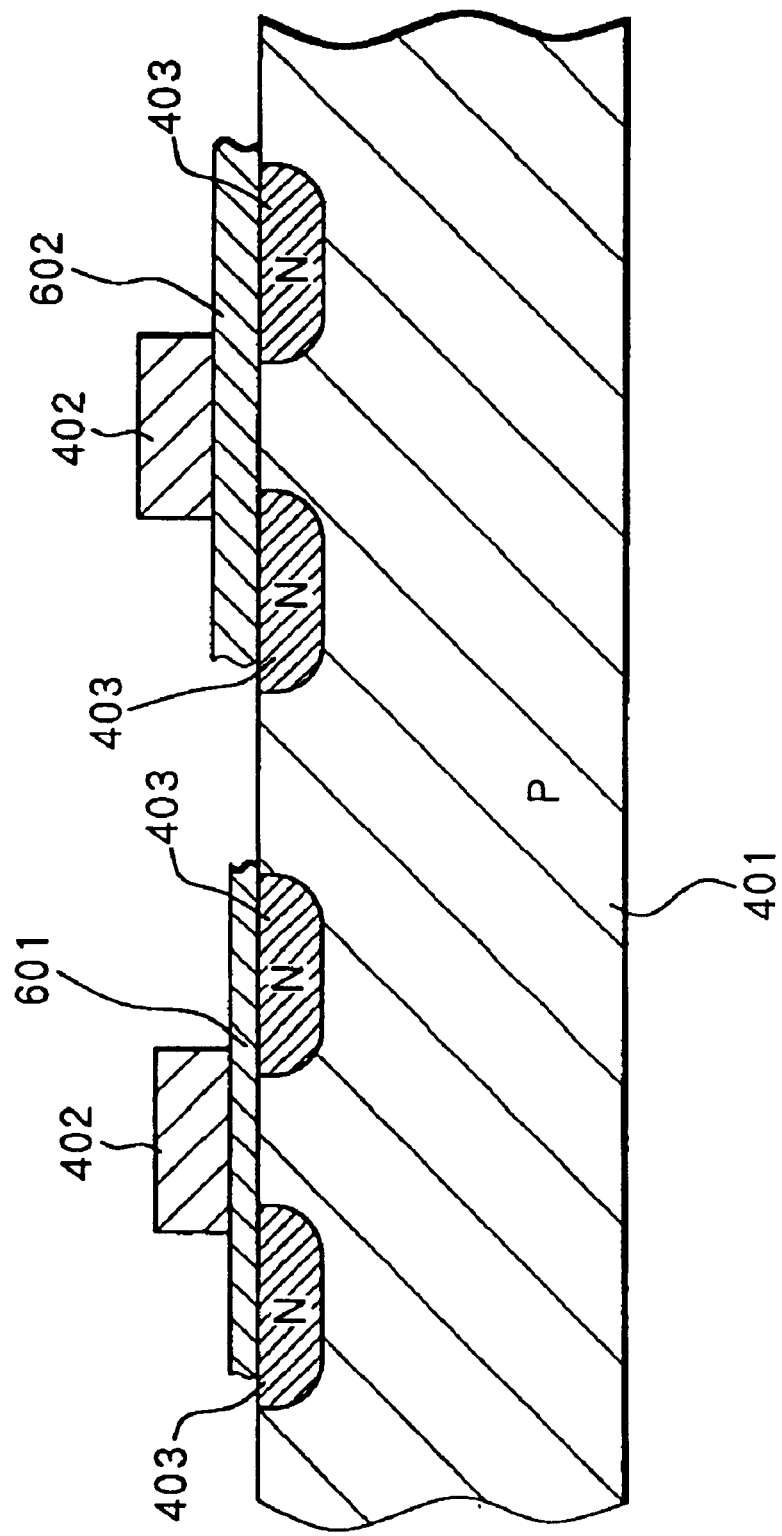
FIG. 9 is a cross-sectional view showing configurations of transistors according to the second embodiment of the present invention.

As another method for changing a threshold voltage, there is a method of configuring a transistor as shown in FIG. 9. Note, in FIG. 9, the same portions as those shown in FIG. 7 are referred to by the same reference numerals, and explanation of them are omitted.

Reference numerals 601 and 602 denotes are dielectric films under gate electrodes of respective FETs. The dielectric films are called "gate dielectric film" hereinafter. By different thickness of gate dielectric film, provided between the gate electrode 402 of a desired transistor, and the semiconductor substrate 401 from the thickness of gate dielectric film of other transistor, it is possible to form the transistor having a different threshold voltage from that of the other transistor.

Further, the same effect is obtained by using different materials, having different dielectric constants, as the gate dielectric films in different transistors. For example, silicon oxide may be used in one transistor and silicon nitride may be used in another transistor. In this way, it is possible to form a transistor having a different threshold voltage from that of the other transistor.

(4) Controlling Substrate Bias Voltage

Figure 10:
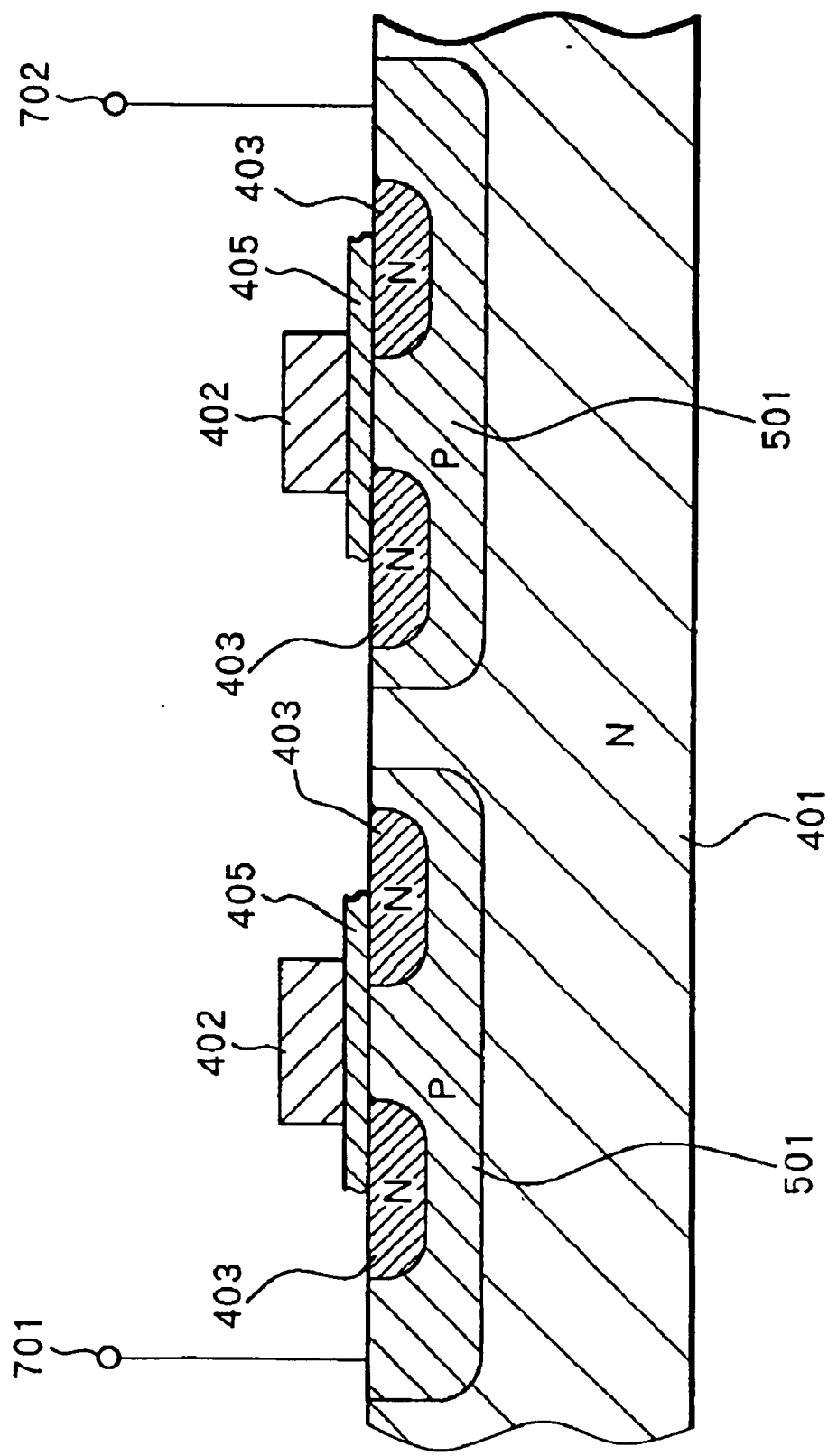
FIG. 10 is a cross-sectional view showing configurations of transistors according to the second embodiment of the present invention.

As another method for changing the threshold voltage, there is a method of configuring a transistor as shown in FIG. 10. Note, in FIG. 10, the same portions as those shown in FIG. 7 are referred to by the same reference numerals, and explanation of them are omitted.

Here, each FET is formed in each well 501 whose conductive type is opposite to that of the source and drain. The well 501, where a transistor whose threshold voltage is desired to be changed is formed, is separated at a distance from other wells for other transistors. The wells 501 in FIG. 10 are connected to different power supplies 701 and 702. In this configuration, by different voltages of the power supplies 701 and 702 from each other, it is possible to make the threshold voltage of a desired transistor differing from that of the other transistor due to so-called back-gate effect in a FET.

With the aforesaid configuration, it is possible to change a threshold voltage by changing a voltage of a power supply after semiconductor process; therefore, the threshold is controlled more precisely. Further, feed back is swiftly performed to make the threshold voltage in the optimal condition. Further, conditions for forming the wells may be designed identical for all the transistors, semiconductor manufacturing process for forming the transistors may be simplified.

(5) Controlling Length of Gate Electrode

Figure 11:
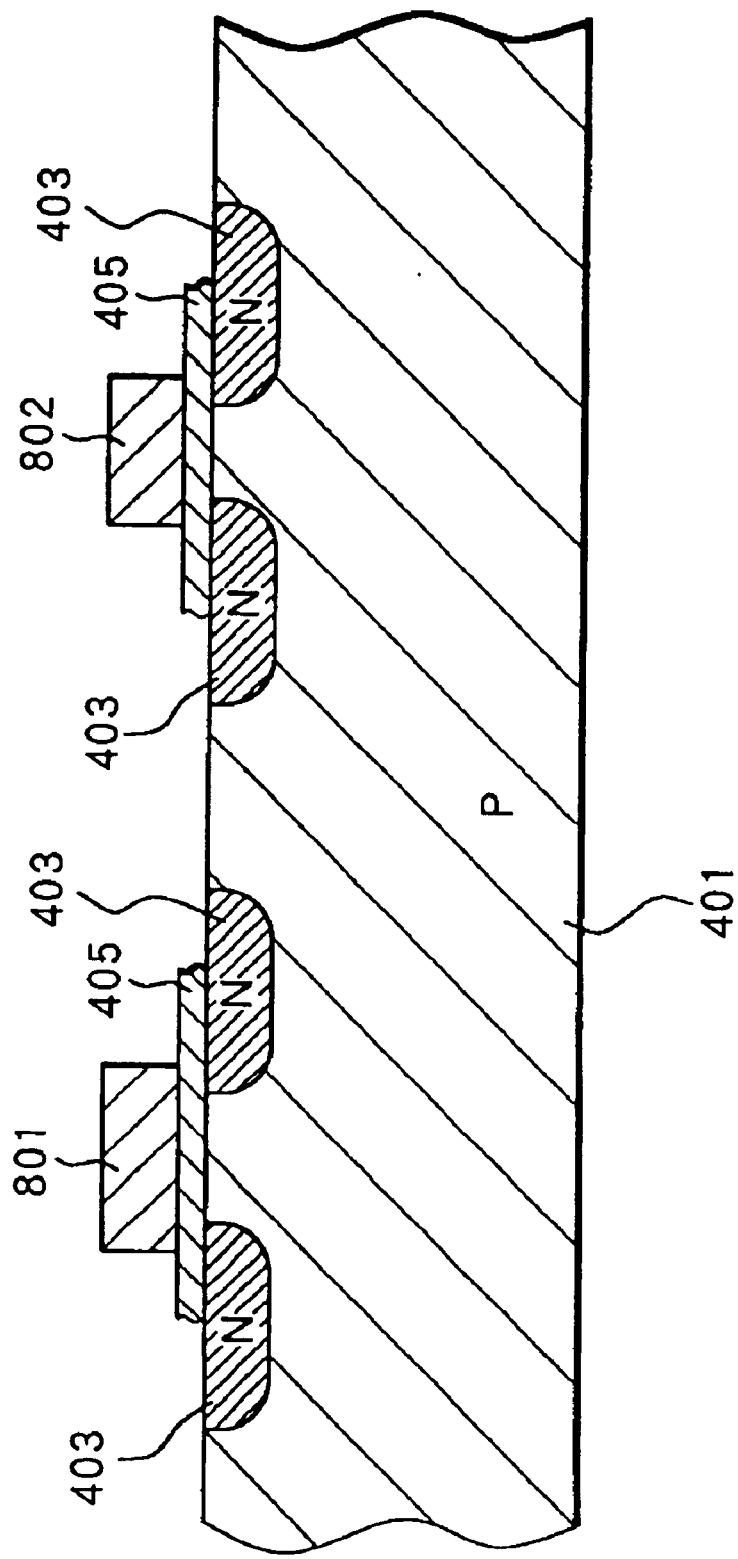
FIG. 11 is a cross-sectional view showing configurations of transistors according to the second embodiment of the present invention.

FIG. 11 shows another method for changing the threshold voltage of a transistor. Note, in FIG. 11, the same portions as those shown in FIG. 7 are referred to by the same reference numerals, and explanation of them are omitted.

Referring to FIG. 11, the lengths of gate electrodes 801 and 802 of transistors are varied. In an insulated-gate FET, a phenomena that, when the gate length is less than 3~4 μm, the threshold voltage drops due to a fringe electric field effect at the source edge and the drain edge of a channel is known. This is called a short channel effect.

The configuration shown in FIG. 11 utilizes the short channel effect, and by differing the gate length of a desired transistor from that of the other transistor, it is possible to realize different threshold voltages.

According to the foregoing configuration, transistors of single type are to be formed in a semiconductor manufacturing process; therefore, the transistors are manufactured at low cost. Further, it is unnecessary to provide extra power supply terminals as the configuration shown in FIG. 10, a control circuit is simplified.

(6) Controlling Width of Gate Electrode

Figure 12:
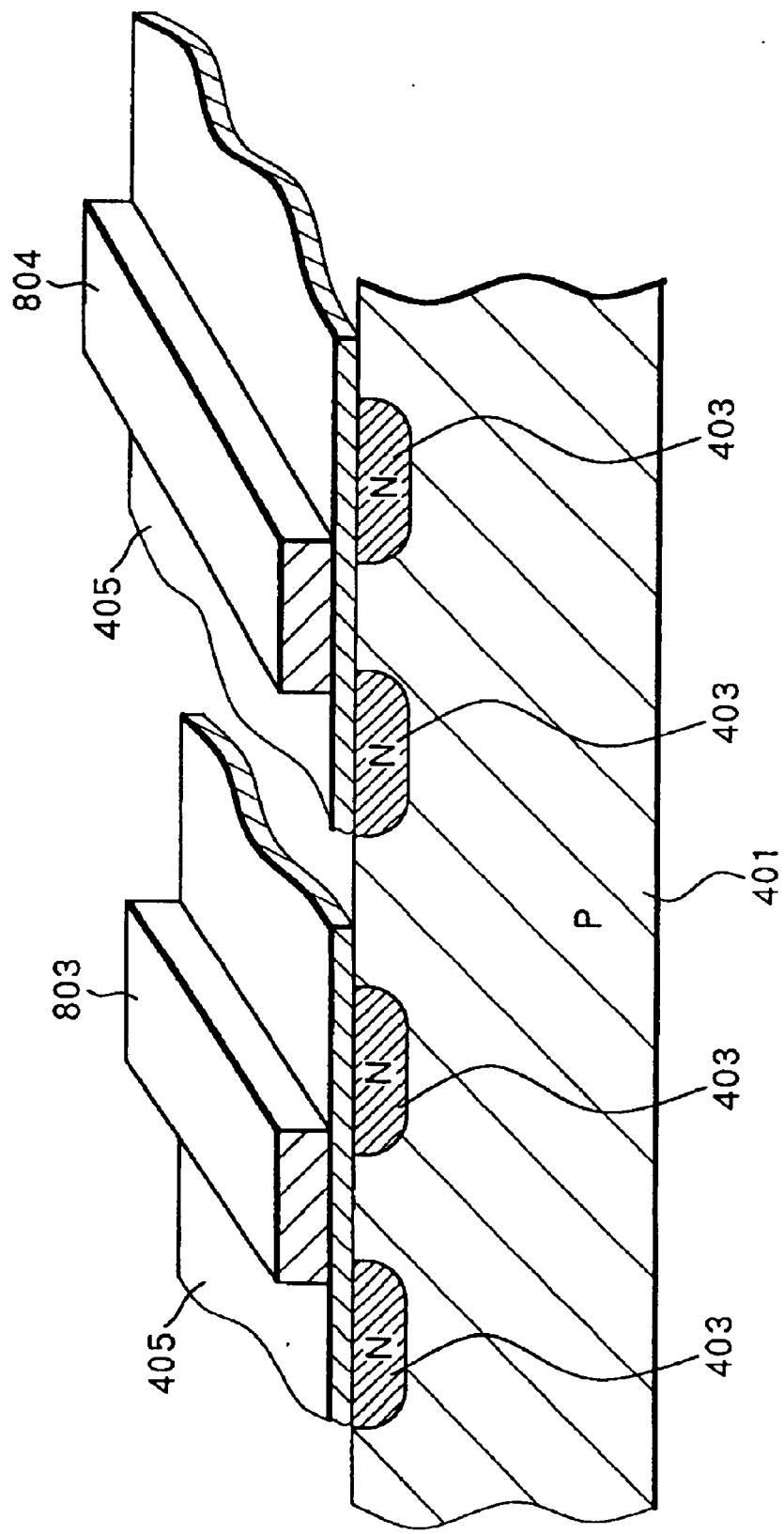
FIG. 12 is a cross-sectional perspective view showing configurations of transistors according to the second embodiment of the present invention.

FIG. 12 shows another method for changing the threshold voltage of a transistor. Note, in FIG. 12, the same portions as those shown in FIG. 7 are referred to by the same reference numerals, and explanation of them are omitted.

Referring to FIG. 12, the widths of gate electrodes 803 and 804 of transistors are varied. In an insulated-gate FET, a thick dielectric film is generally provided between adjacent elements for isolating each other, and the impurity concentration of the substrate under the elements is designed high so that inversion does not occur easily. Thus, when the ratio of element separation region to the width of the gate electrode is not ignorable, the threshold voltage increases. This phenomenon is known as a narrow channel effect. The configuration shown in FIG. 12 utilizes this phenomenon, and, by differing the width of the gate electrode of a desired transistor from that of the other transistor, it is possible to realize different threshold voltages.

With the above configuration, transistors of single type are to be formed in a semiconductor manufacturing process; therefore, the transistors are manufactured at low cost. Further, as it is unnecessary to provide extra power supply terminals as the configuration shown in FIG. 10, a control circuit is simplified.

According to the second embodiment as described above, in addition to the same effect as that of the first embodiment, it is possible to increase current allowed to flow through the source follower of the photoelectric conversion device without narrowing dynamic range.

In the second embodiment, n type FET are explained as an example, however, p type FET may be used, instead of the n type FET, by controlling their threshold voltages in the similar manner.

Further, for expressing the current $I_a$ flowing through the row selection switch 103, gradual channel approximation (equation (10)) is used in the above embodiments. This represents characteristics of an ideal transistor. If a practical transistor is not as ideal as a transistor represented by the equation (10) due to the size reduction, the effects of the present invention are preserved. The principle of the present invention is to control the ON-state impedance of a FET so as to satisfy the equation (7), and, as described in the second embodiment, it is very effective to design the row selection switch 103 and the reset switch 114 to have different threshold voltages.

<Third Embodiment>

Next, the third embodiment of the present invention will be explained. In the third embodiment, the voltages V2 and V3, applied to the gates of the reset switch 114 and the row selection switch 103, are set to different values so as to satisfy the equation (12).

If the threshold voltages of the MOS transistors 114, 103 and 102, when the reset voltage $V_{sig0}$ is applied to the gate of the MOS transistor 102, are identical ($V_{th0}=V_{th1}=V_{th2}=V_{th}$), by solving the equation (12) for $(Ia/K)^{1/2}$, $$(I_a/K)^{1/2} < -V2+V3+V_{th} \qquad (19)$$

is obtained. By setting V3>V2, the right hand side of the equation (19) is greater than $V_{th2}$ in the equation (13), i.e., $-V2+V3+V_{th}>V_{th2}$. Accordingly, it is possible to set the current $I_a$ in the equation (19) to a value greater than that in the equation (13).

According to the third embodiment as described above, in addition to the same effect as that of the first embodiment, it is possible to increase current allowed to flow through the source follower of the photoelectric conversion device without narrowing dynamic range.

Further, it is possible to change the threshold voltage by changing the voltage of a power supply after semiconductor manufacturing process; therefore, the threshold is controlled more precisely. Further, feed back is swiftly performed to make the threshold voltage in the optimal condition.

Note, in the third embodiment, it is also possible to design the row selection switch 103 to have a different threshold voltage from the MOS transistor 102 and the reset switch 114, as described in the second embodiment.

<Fourth Embodiment>

As the fourth embodiment, a case where the reset switch 114 operates in the saturation region, and the row selection switch 103 operates in the linear region is explained. In this case, considering that the current flowing through the row selection switch 103 is the same as that flowing through the source follower, the following equation (21) is obtained with reference to FIG. 6.

$$I_a = K(V3-V1-V_{th1})^2 - K(V3-V_{c1}-V_{th1})^2 \qquad (20)$$

where $K=1/2 \times \mu \times Cox \times W/L$ $\mu$: Mobility

Cox: Capacitance of gate oxide per unit area

W: Gate width

L: Gate length

By solving the equation (20) for V1, then $$V1 = V3 - V_{th1} - (I_a/K + (V3-V_{c1}-V_{th1})^2)^{1/2} \qquad (21)$$

is obtained.

By plugging the equation (21) and the equation (9), shown in the first embodiment, into the equation (1), the condition for the source follower to operate in the linear operation region when the reset voltage $V_{sig0}$ is applied to the gate of the MOS transistor 102 is expressed as follows.

$$V3 - V_{th1} - (I_a/K + (V3-V_{c1}-V_{th1})^2)^{1/2} > V2 - V_{th0} - V_{th2} \qquad (22)$$

In the fourth embodiment, by controlling the threshold voltage of the reset switch 114 and the threshold voltage of the row selection switch 103 to satisfy the above equation (22) in the same manner as described in the second embodiment, it is possible to make the source follower to always operate in the linear operation region.

Further, it is also possible to control the voltages V2 and V3 to be applied to the gates of the reset switch 114 and the row selection switch 103 in such a manner that described in the third embodiment.

Furthermore, it is also possible to control the voltage of the power supply of the source follower.

<Fifth Embodiment>

Figure 13:
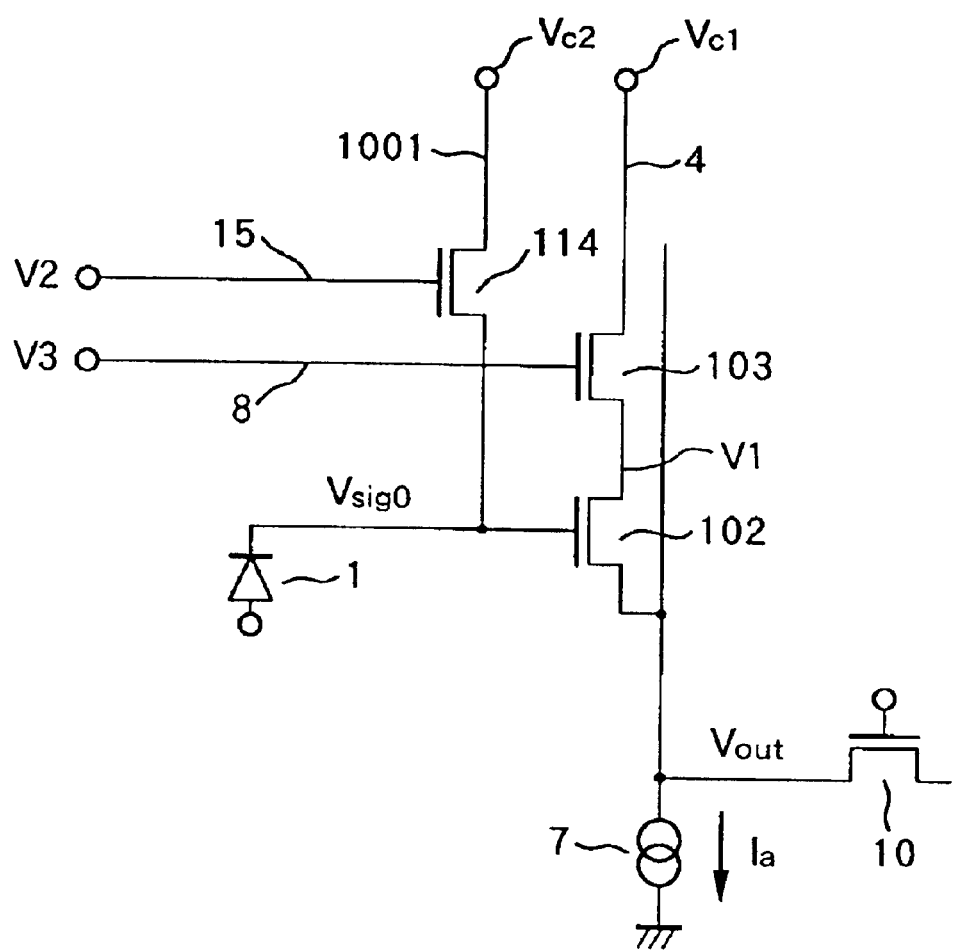
FIG. 13 is a circuit diagram showing one photoelectric conversion element and its peripheral circuit corresponding to a single pixel according to a fifth embodiment of the present invention.

FIG. 13 is a circuit diagram showing one photoelectric conversion element 1 and its peripheral circuit corresponding to a single pixel according to the fifth embodiment of the present invention. Note, in FIG. 13, the same elements as those shown in FIG. 6 are referred to by the same reference numerals, and explanation of them are omitted.

In FIG. 13, reference numeral 1001 denotes a power supply line that is exclusively provided for the reset switch 114 and different from the power supply line for the source follower. To the power supply line 1001, a voltage $V_{c2}$ is applied. In the fifth embodiment, the reset switch 114 is designed to operate in the linear region ($V_{c2} - V_{sig0} \leq V2 - V_{sig0} - V_{th0} \rightarrow V_{c2} \leq V2 - V_{th0}$), and the row selection switch 103 is designed to operate in the saturation region. In this case, the reset voltage $V_{sig0}$ is expressed by the following equation.

$$V_{sig0} = V_{c2} \qquad (23)$$

By plugging the equation (23) and the equation (11), shown in the first embodiment, into the equation (1), then a condition for the source follower to operate in the linear operation region when the reset voltage $V_{sig0}$ is applied to the gate of the MOS transistor 102 is expressed as follows.

$$V3 - V_{th1} - (I_a/K)^{1/2} > V_{c2} - V_{th2} \text{ where } V_{c2} \leq V2 - V_{th0} \qquad (24)$$

Thus, by setting the voltage $V_{c2}$ of the power supply for the reset switch 114 to a value different from the voltage $V_{c1}$ for the source follower, it is possible to make the source follower to always operate in the linear operation region.

Note, in the fifth embodiment, it is also possible to design the MOS transistor 103 to have a different threshold voltage from those of the MOS transistors 102 and 114, as described in the second embodiment.

<Sixth Embodiment>

Next, a case where both of the reset switch 114 and the row selection switch 103 shown in FIG. 13 are designed to operate in the linear region is explained in the sixth embodiment. By plugging the equation (23), shown in the fifth embodiment, and the equation (21), shown in the fourth embodiment, into the equation (1), a condition for the source follower to operate in the linear operation region when the reset voltage $V_{sig0}$ is applied to the gate of the MOS transistor 102 is expressed by the following equation.

$$V3 - V_{th1} - (I_a/K + (V3 - V_{c1} - V_{th1})^2)^{1/2} > V_{c2} - V_{th2} \text{ where} \\ (V_{c2} \leq V2 - V_{th0}) \quad (25)$$

In the sixth embodiment, by controlling the threshold voltage $V_{th0}$ of the reset switch 114 and the threshold voltage $V_{th1}$ of the row selection switch 103 in the same manner as described in the second embodiment, it is possible to make the source follower to always operate in the linear operation region.

Further, it is also possible to control the voltages V2 and V3 to be applied to the gates of the reset switch 114 and the row selection switch 103 in such a manner that described in the third embodiment.

Furthermore, it is also possible to control of the power supply voltage $V_{c2}$ for the reset switch 114 and the power supply voltage $V_{c1}$ for the source follower in such a manner that described in the fifth embodiment.

<Seventh Embodiment>

Figure 14:
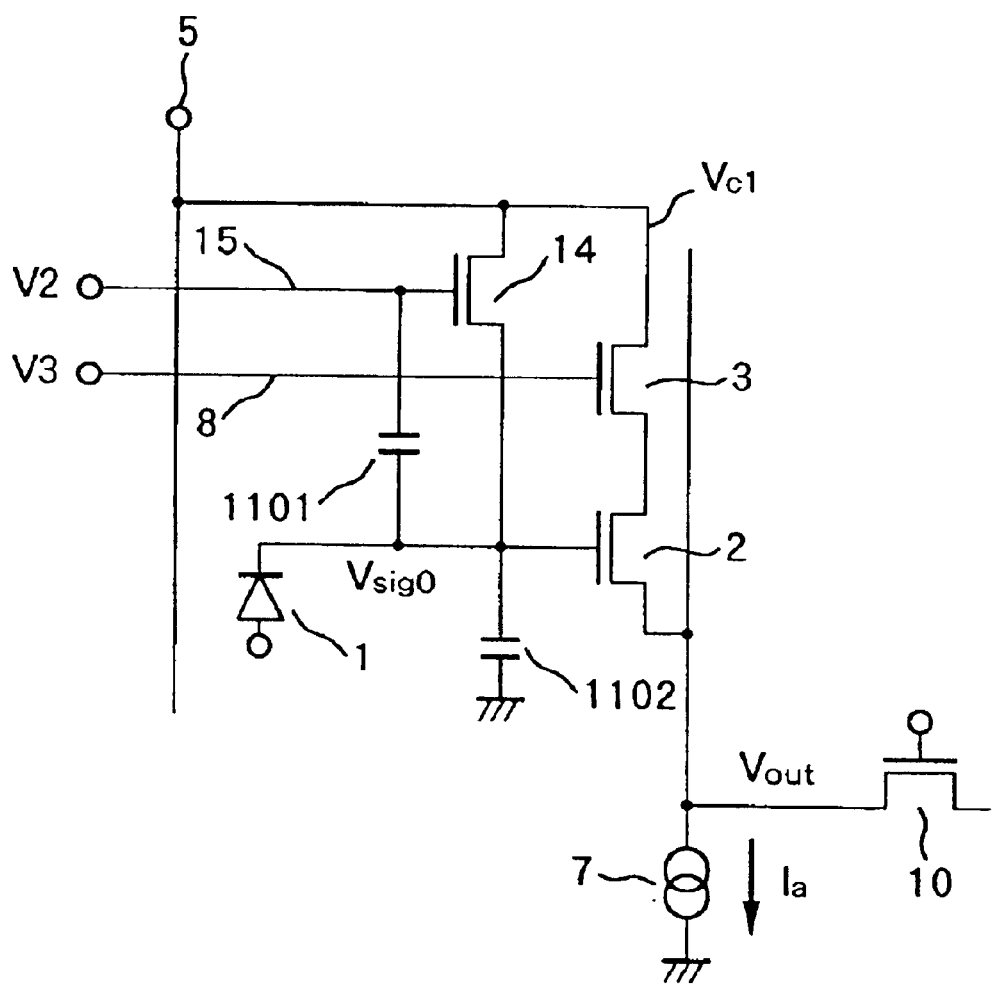
FIG. 14 is a circuit diagram showing one photoelectric conversion element and its peripheral circuit corresponding to a single pixel according to a seventh embodiment of the present invention.

FIG. 14 is a circuit diagram showing one photoelectric conversion element 1 and its peripheral circuit corresponding to a single pixel according to the seventh embodiment of the present invention. Note, in FIG. 14, the same elements as those shown in FIG. 6 are referred to by the same reference numerals, and explanation of them are omitted.

In FIG. 14, reference numeral 1101 is a first capacitor formed between the gate of the reset switch 114 and the gate of the MOS transistor 102. As for the capacitor 1101, it may be intentionally formed, or parasitic capacitance may be utilized. Reference numeral 1102 denotes a second capacitor formed between the gate of the MOS transistor 102 and ground.

With the above configuration, the gate voltage of the MOS transistor 102 is reset to a voltage determined on the basis of potentials of the source, gate, drain, and well of the reset switch 114. Next, the reset switch 114 is turned off by changing the gate voltage of the switch 114. At this point, the gate voltage of the MOS transistor 102 changes by an amount which depends upon the ratio of the first capacitance 1101 to the second capacitance 1102 due to the capacitive coupling between the gate line 15 of the reset switch 114 and the gate of the MOS transistor 102. For instance, when the reset switch 114 is an n-channel transistor, it is possible to change the potential at the gate of the MOS transistor 102 to a potential lower than the initial reset voltage. Let the changed amount be ΔV, and rewriting the equation (12) described in the first embodiment, then, $$V3 - V_{th1} - (I_a/K)^{1/2} > V2 - V_{th0} - \Delta V - V_{th2} \quad (26)$$

is obtained. As shown in the equation (26), by controlling the value of the capacitance 1101 formed between the gate of the reset switch 114 and the gate of the MOS transistor 102, and the value of the capacitance 1102 formed between the gate of the MOS transistor 102 and the ground, it is possible to change the reset voltage so as to let a source follower operate linearly. In the above configuration, transistors of single type are to be formed in identical semiconductor process; therefore, the transistors are manufactured at low cost. Further, in addition to the same effect as that of the first embodiment, it becomes unnecessary to provide extra power supply terminals as described in a method of changing threshold voltage (4) in the second embodiment, by controlling substrate bias voltage.

<Eighth Embodiment>

Figure 15:
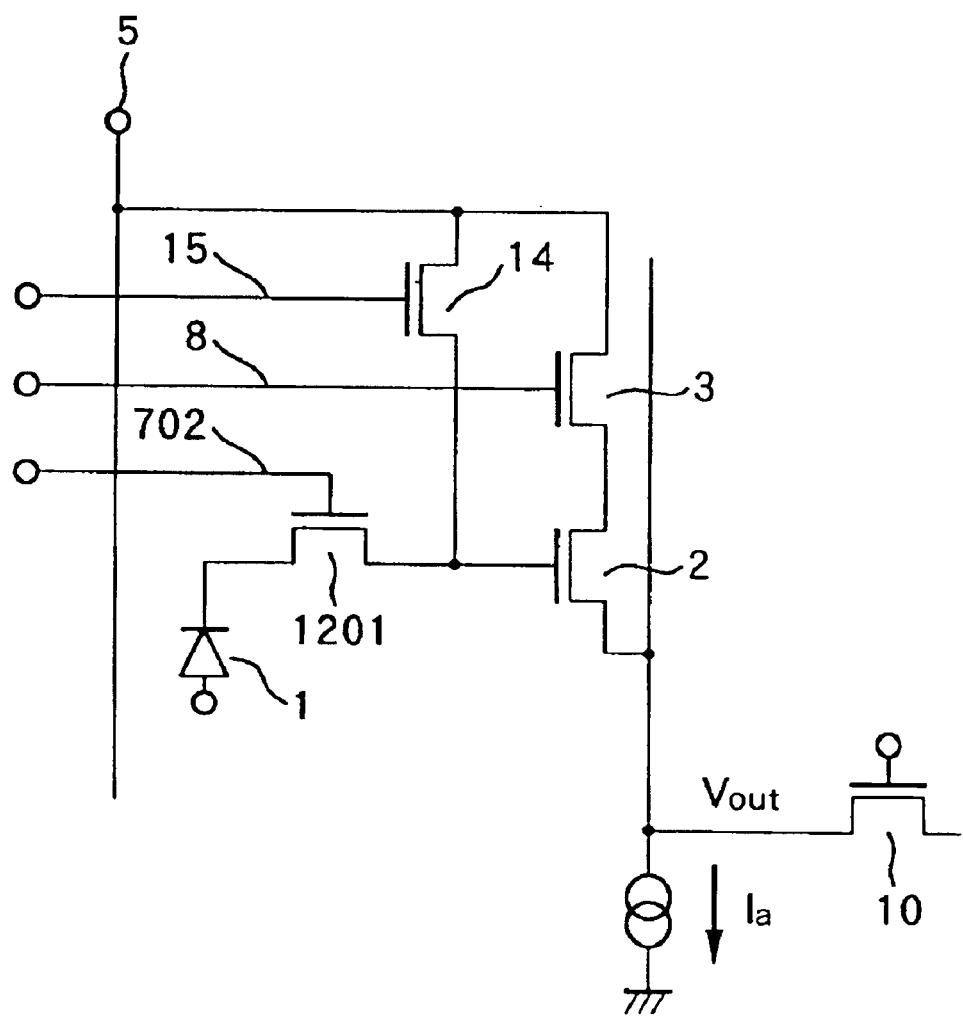
FIG. 15 is a circuit diagram showing one photoelectric conversion element and its peripheral circuit corresponding to a single pixel according to an eighth embodiment of the present invention.

FIG. 15 is a circuit diagram showing one photoelectric conversion element 1 and its peripheral circuit corresponding to a single pixel according to the eighth embodiment of the present invention. Note, in FIG. 15, the same elements as those shown in FIG. 6 are referred to by the same reference numerals, and explanation of them are omitted.

In FIG. 15, reference numeral 1201 denotes a charge transfer switch for performing complete depletion transfer of signal charge from the photoelectric conversion element 1 to the gate of the MOS transistor 102. Reference numeral 702 denotes a transfer gate line for controlling the transfer switch 1201. Generally speaking, in order to increase a sensitivity of the photoelectric conversion device, the photoelectric conversion element 1 is designed to have large area to increase the amount of signal charge which can be stored. However, in response to the area, parasitic capacitance on the gate of the MOS transistor 102 increases; accordingly, conversion efficiency of converting photo-charge into a voltage deteriorates, which prevents the sensitivity from improving efficiently. To cope with this problem, by providing the transfer switch 1201, designing the capacitance of the gate of the MOS transistor 102 to be smaller than the capacitance of the photoelectric conversion element 1 (e.g., photodiode), and performing the complete depletion transfer, photo-charge generated by large-sized photoelectric conversion element 1 is converted to a voltage a large voltage variation inversely proportional to the capacitance of the gate of the MOS transistor 102, it is possible to improve the sensitivity.

According to the eighth embodiment as described above, it is also possible to achieve the same effects as that of the first embodiment.

<Ninth Embodiment>

Figure 3:
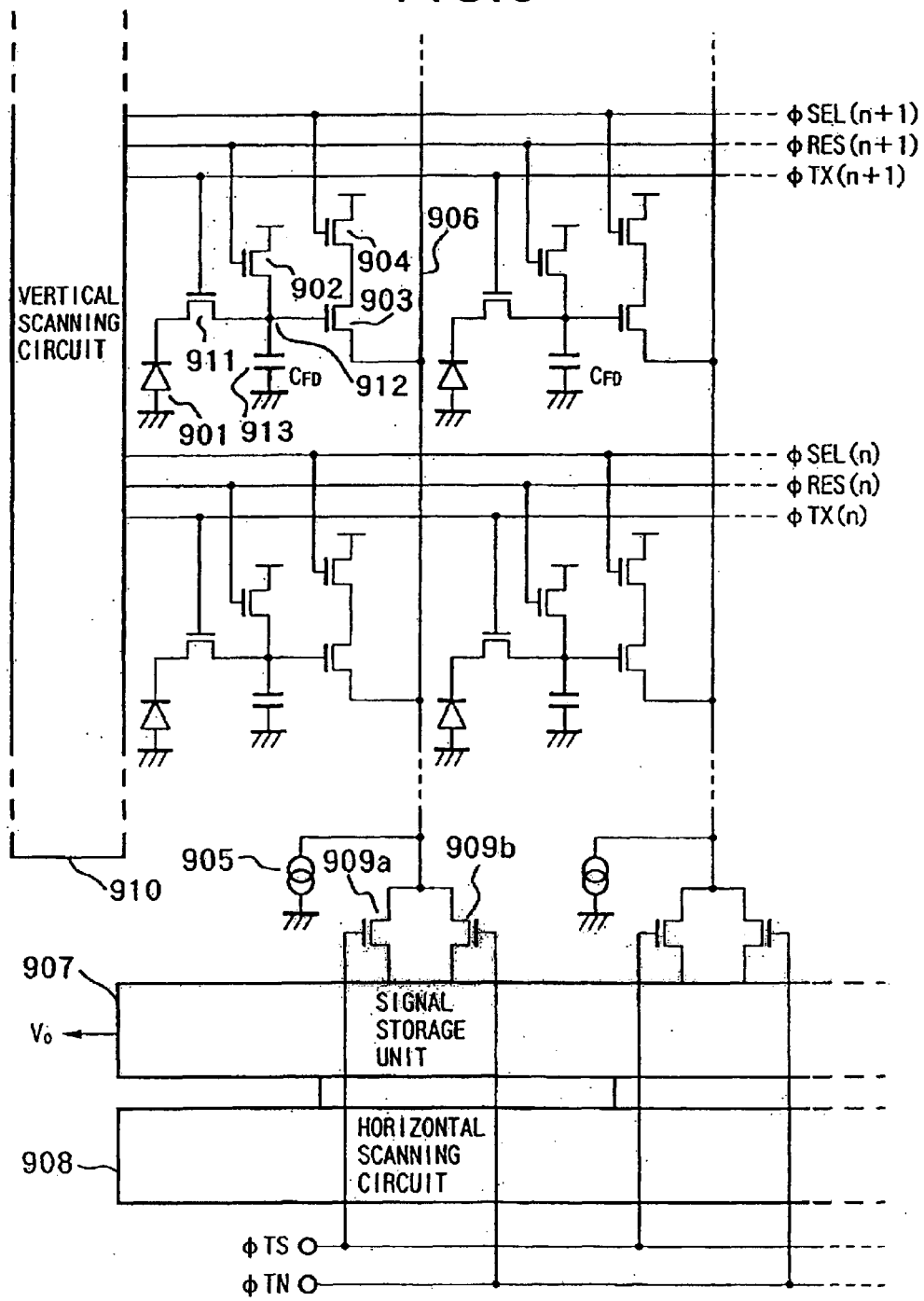
FIG. 3 is a circuit diagram illustrating a brief configuration of another conventional photoelectric conversion device.
Figure 4:
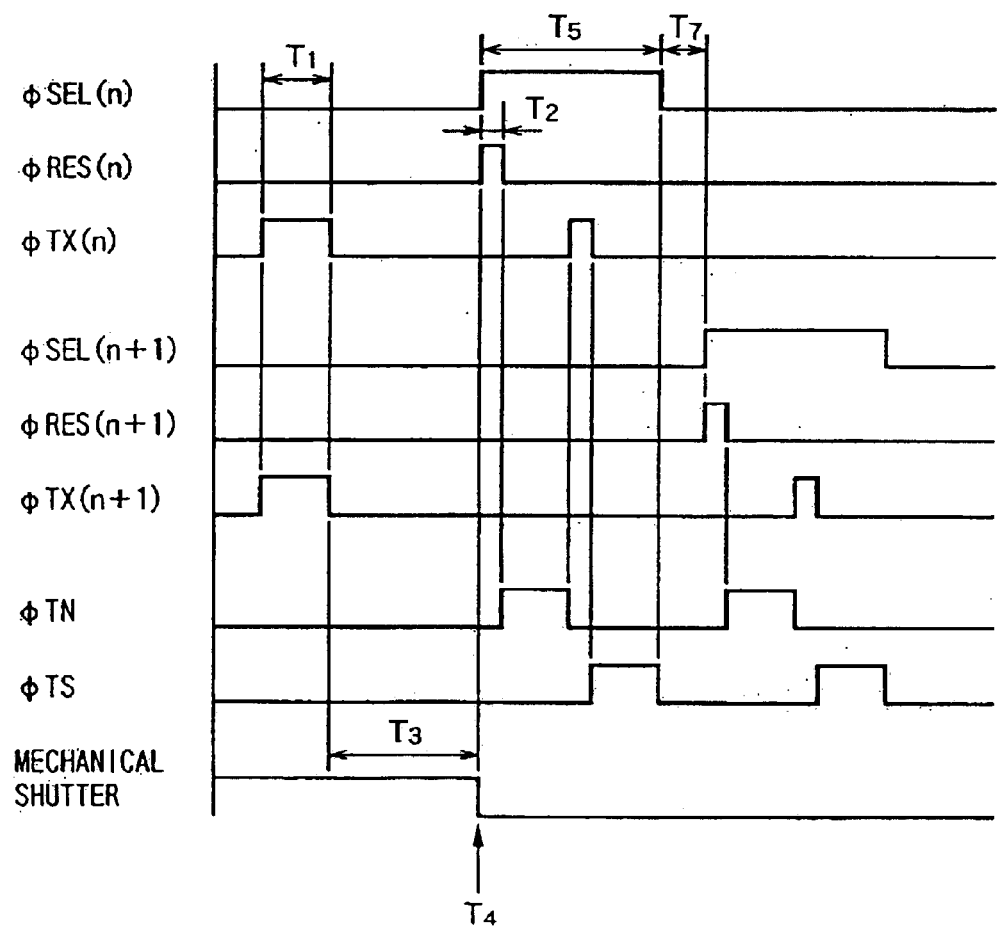
FIG. 4 is a timing chart for operating the photoelectric conversion device shown in FIG. 3.
Figure 5:
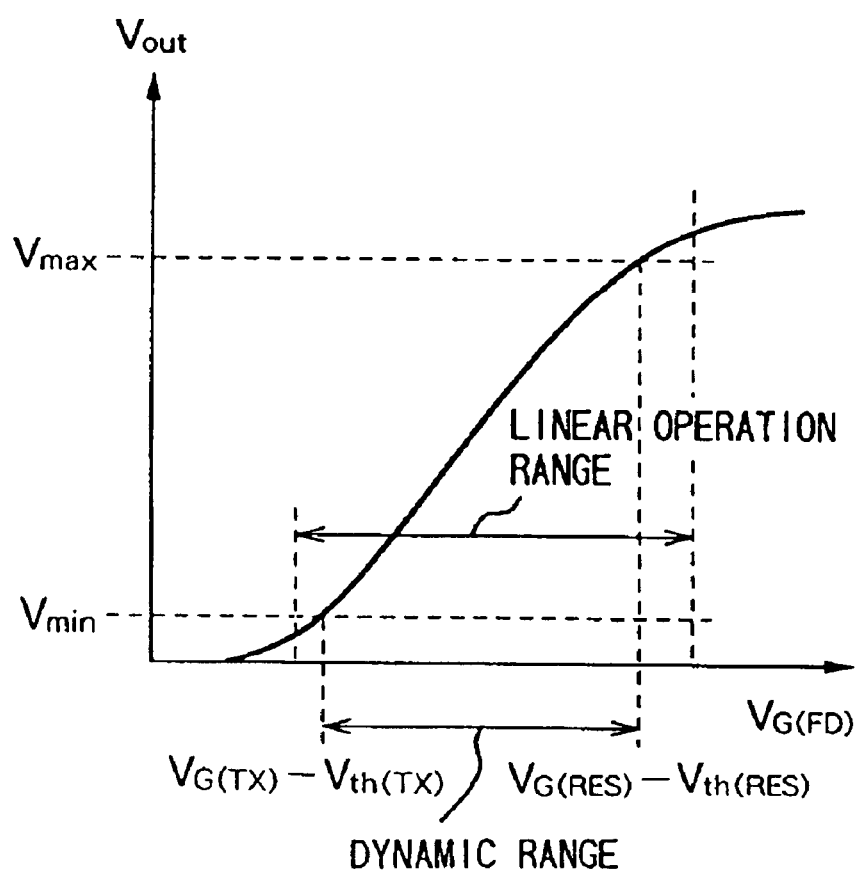
FIG. 5 is a graph for explaining dynamic range.

In the ninth embodiment, a photoelectric conversion device has a configuration shown in FIG. 3, and explanation of it is omitted. With this configuration, in order to widen the input dynamic range Dy, the value obtained by the following equation (5) (described in the "BACKGROUND OF THE INVENTION"), $$\begin{aligned} Dy &= V_G(FD)_{max} - V_G(FD)_{min} \\ &= V_G(RES) - V_G(TX) + V_{th}(TX) - V_{th}(RES) \end{aligned} \quad (5)$$

should increase. For increasing the value Dy, namely, for widening the input dynamic range, the threshold voltage $V_{th}(RES)$ of the reset switch 902 should be set low. This is because, by setting the $V_{th}(RES)$ to a low value, the maximum input level $V_G(FD)_{max}$, expressed by the equation (3), becomes high, and it is possible to make the most use of the linear operation region of the source follower. However, it is necessary to set the threshold voltage of the row selection switch 904 relatively high to secure stability of the switching characteristics of the row selection switch 904.

Therefore, in the ninth embodiment, the threshold voltage $V_{th}(RES)$ of the reset switch 902 and the threshold voltage $V_{th}(TX)$ of the transfer switch 911 are set lower than the threshold voltages of the row selection switch 904 and the MOS transistor 903.

As for a method of realizing different threshold voltages, the various methods explained in the second embodiment may be applied.

However, in a method of forming the doped layer in channel regions, namely, the method (1), thresholds of the transfer switches 911 of different pixels vary from each other as well as thresholds of the reset switches 902 of different pixels vary from each other due to manufacturing variation of transistors, in addition to intentionally formed difference between the threshold $V_{th}(TX)$ of the transfer switch 911 and the threshold $V_{th}(RES)$ of the reset switch 902. This causes a problem in which the input dynamic range Dy, expressed by the equation (5), varies between pixels. Below, a method of forming doped layers in channel regions to cope with the aforesaid problem is explained with reference to FIG. 17. Note, in FIG. 17, the same portions as those shown in FIG. 7 are referred to by the same reference numerals, and explanation of them are omitted.

(1') Forming Doped Layer in Channel Region

Figure 17:
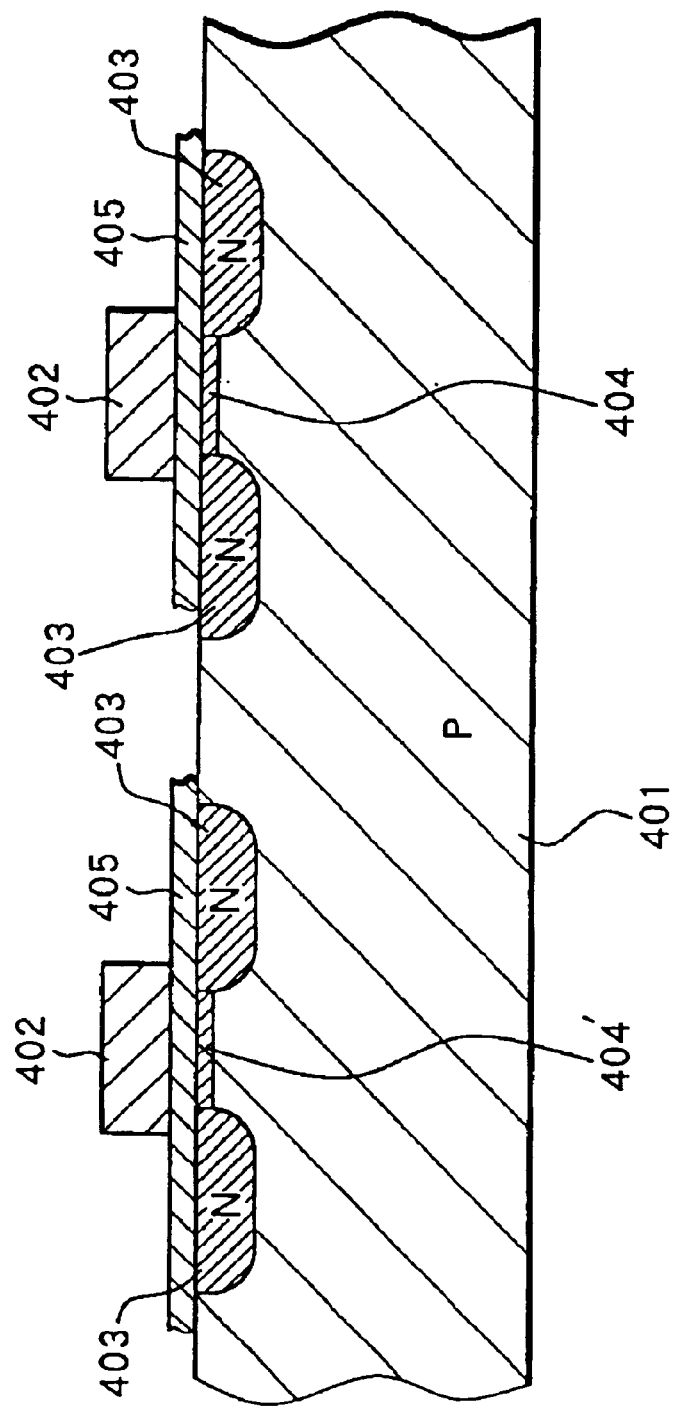
FIG. 17 is a cross-sectional view showing configurations of transistors according to a ninth embodiment of the present invention.

In FIG. 17, reference numerals 404 and 404' denote doped channel regions. By adjusting impurity concentrations of the doped layer 404 and 404' formed in the channel regions of respective transistors, it is possible to easily change the threshold voltage of each transistor. More specifically, doping is performed on a channel region of every transistor once to form the doped layer 404, and then, doping is further performed on a channel region of a desired transistor; thereby doped layers 404 and 404', having different impurity concentrations, are formed. For instance, by doping n type ion to the doped layer 404 in the second doping process, the threshold voltage is lowered compared to transistors to which second doping is not processed. In contrast, by doping p type ion, it is possible to increase the threshold voltage. The amount of change in threshold voltage can be precisely determined by controlling the concentration of the doped layer 404' after the second doping is performed.

Here, only the first doping is performed on the transfer switch 911 and the reset switch 902, while performing both the first and second doping on the MOS 903 and the row selection switch 904. Since the thresholds of the transfer switch 911 and the reset switch 902 are determined in a single process, an amount and direction of manufacturing variation of transistors become the same between the thresholds $V_{th}(TX)$ and $V_{th}(RES)$ of the transfer switch 911 and the reset switch 902, thus the value of the $V_{th}(TX)-V_{th}(RES)$ in the equation (5) is stabilized; as a result, the input dynamic range is stabilized.

Further, since the impurity concentration of the channel regions of the transfer switch 911 and the reset switch 902 is lower than that of the MOS transistor 903 and the row selection switch 904, the thresholds of the transfer switch 911 and the reset switch 902 become greater than those of the MOS transistor 903 and the row selection switch 904. Thus, the dynamic range is widened.

<Tenth Embodiment>

Figure 18:
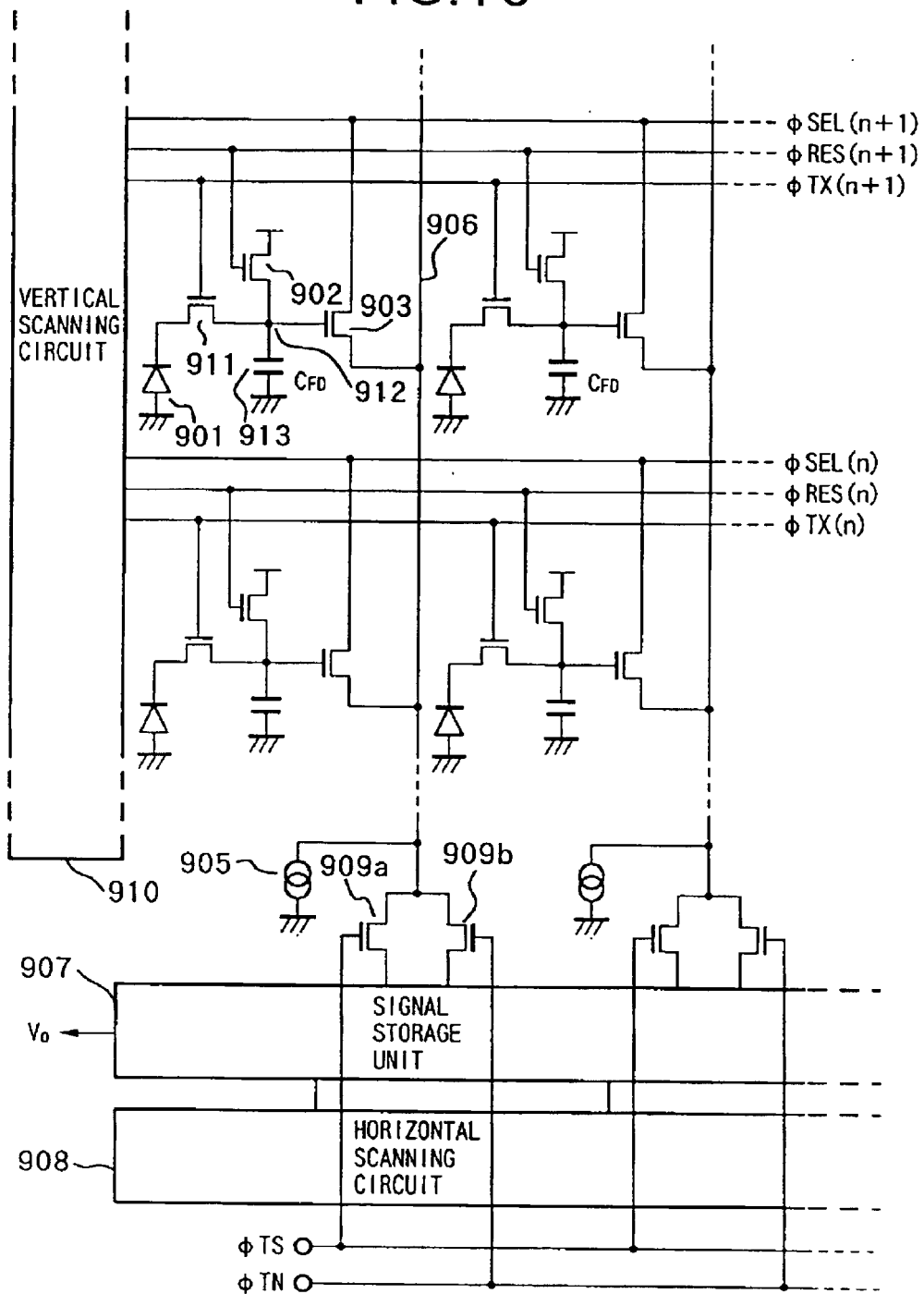
FIG. 18 is a circuit diagram illustrating a configuration of a photoelectric conversion device according to a tenth embodiment.

In the tenth embodiment, a case where the row selection switch 904, shown in FIG. 3, is omitted is explained. FIG. 18 is a circuit diagram illustrating a configuration of a photoelectric conversion device according to the tenth embodiment. Note, in FIG. 18, the same elements as those shown in FIG. 3 are referred to by the same reference numerals, and explanation of them are omitted.

Referring to FIG. 18, photo-charge stored in the photodiode 901 are provided to the gate of the MOS transistor 903 via the transfer switch 911, and as the selection pulse ΦSEL becomes high, the MOS transistor 903 is activated. Then, the charges are read out as the source follower is driven by the constant current source 905, and a signal corresponding to the gate voltage of the MOS transistor 903 appears on the vertical output line 906. Thereafter, when the signal ΦTS becomes high, charges consequently corresponding to the photo-charge generated by the photodiode 901 are stored in the signal storage unit 907.

Thereafter, before turning on the transfer switch 911, the gate of the MOS transistor 903 is reset to a high level by making the signal ΦRES high. Right after the reset operation, by making the selection signal ΦSEL turned to high, the MOS transistor 903 is activated. In this case, a noise component is stored via the vertical output line 906 in the signal storage unit 907 by turning on the transfer gate 909b.

According to the aforesaid photoelectric conversion device, since no row selection switch is used, the upper limitation for the MOS transistor 903 to operate in the saturation region is removed. Therefore, by setting the reset voltage high, it is possible to increase the linear operation range of the source follower. Further, since $V_G(RES)-V_{th}(RES)=V_G(SF)$ where $V_G(RES)$ is the gate voltage of the reset switch 902 and $V_G(SF)$ is a reset potential at the gate of the MOS transistor 903, by lowering the threshold voltage $V_{th}(RES)$ of the reset switch 902, it is possible to increase the reset potential $V_G(SF)$.

Whereas, the threshold voltage $V_{th}(SF)$ of the MOS transistor 903 should not be set low for stabilizing its operation. Therefore, $$V_{th}(SF)>V_{th}(RES) \qquad (27)$$

should hold.

It is possible to use various methods for changing threshold voltages described in the second embodiment and a method described in the ninth embodiment with reference to FIG. 17 to satisfy the equation (17). Especially, in the method described in the ninth embodiment with reference to FIG. 17, since the impurity concentration in the channel region of the reset switch 902 is lower than that of the MOS transistor 903, the threshold $V_{th}(SF)$ of the MOS transistor 903 is higher than the threshold $V_{th}(RES)$ of the reset switch 902, which satisfies the condition (27). Accordingly, input dynamic range is widened as well as the manufacturing variation of transistors is reduced.

<Eleventh Embodiment>

Figure 19:
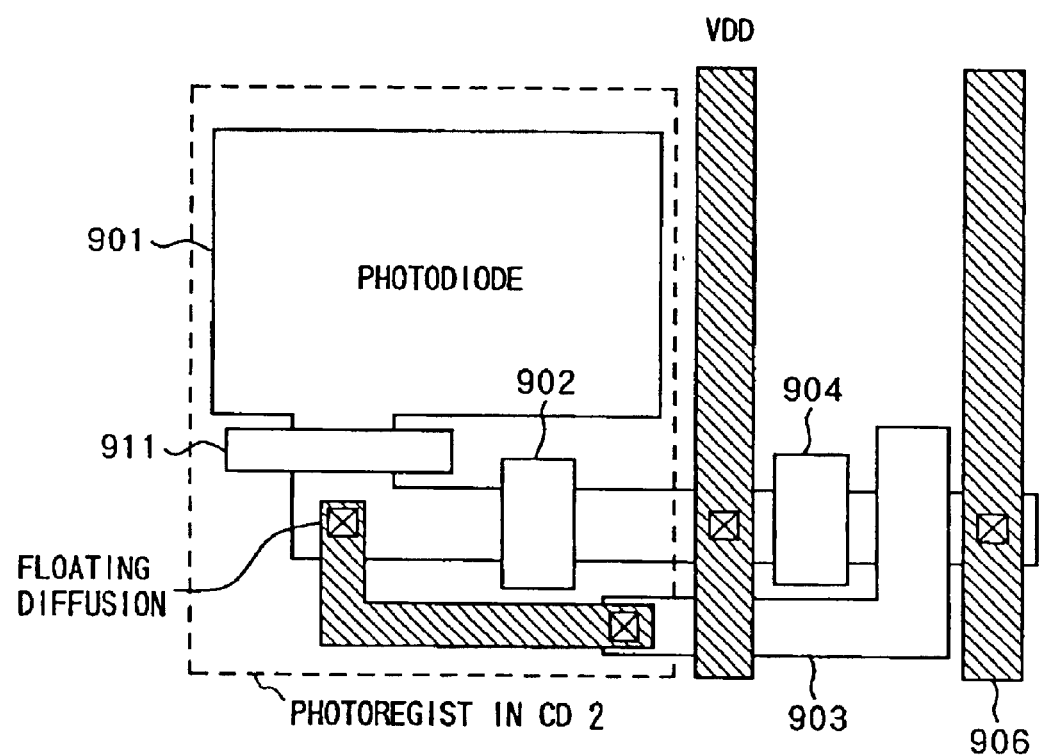
FIG. 19 is a plan view showing a single pixel of the photoelectric conversion device shown in FIG. 3 according to an eleventh embodiment.

Next, the eleventh embodiment of the present invention is explained with reference to FIG. 19. FIG. 19 is a plan view of a single pixel of the photoelectric conversion device shown in FIG. 3. The photoelectric conversion device shown in FIG. 19 includes a photodiode 901, a transfer switch 911 for transferring photo-charge generated by the photodiode 901, a MOS transistor 903 having a floating diffusion unit, a reset switch 902 for resetting the floating diffusion unit, a row selection switch 904 connected to the drain of the MOS transistor 903. Further, a power supply line VDD and a vertical output line 906 are provided.

To manufacture this configuration, in the first doping to channel region, performed on channel areas of all the MOS transistors, and before performing the second doping, the transfer switch 911 and the reset switch 902 are covered with photoregist as shown by a dotted line labeled with "photoregist in CD2 (second channel doping)", then ion implantation is performed.

Further, by designing the gate lengths of the transfer switch 911 and the reset switch 902 to be short and designing the gate lengths of the MOS transistor 903 and the row selection switch 904 to be long, and/or by designing the channel length of the row selection switch 904 to be longer than the channel lengths of the reset switch 902 and the MOS transistor 903, it is possible to increase the linear operation range of the photoelectric conversion device.

Figure 20:
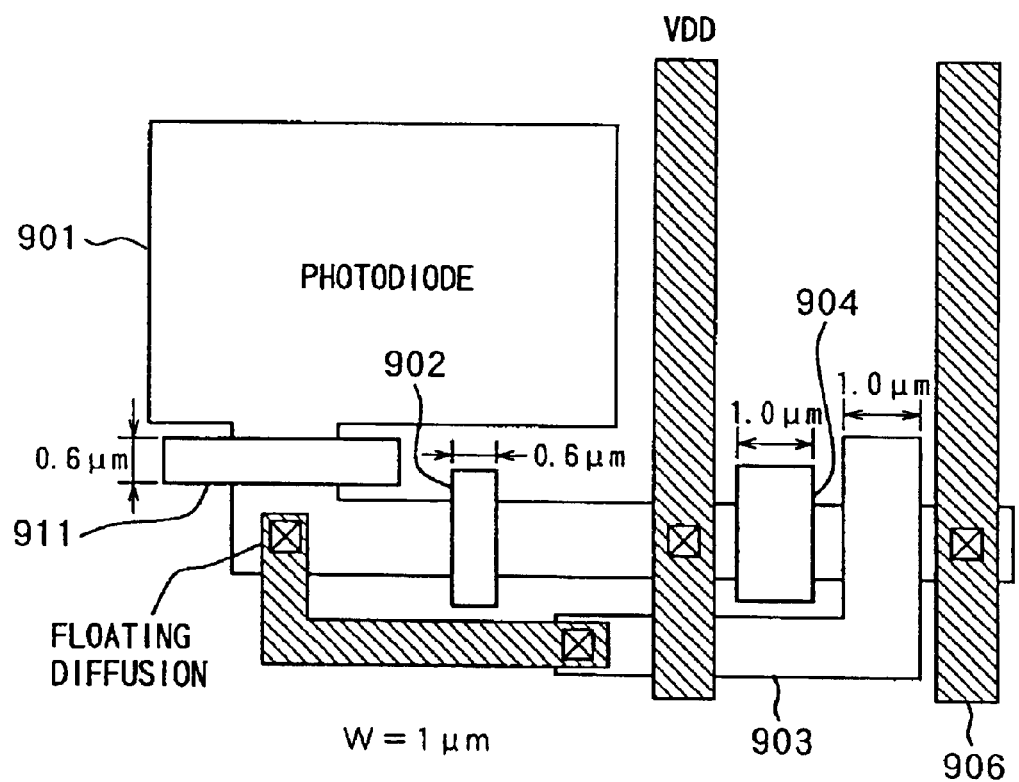
FIG. 20 is a plan view showing a specific configuration of the single pixel of the photoelectric conversion device shown in FIG. 19 according to the eleventh embodiment.

FIG. 20 is a plan view showing an example of a specific arrangement of a pixel of the photoelectric conversion device shown in FIG. 19. Referring to FIG. 20, the channel length of the transfer switch 911 is 0.6 μm, the channel length of the reset switch 902 for resetting the floating diffusion unit is 0.6 μm, the channel length of the MOS transistor 903 is 1.0 μm, and the channel length of the selection switch 904 is 1.0 μm.

Accordingly, it is possible to widen the input dynamic range of the source follower as well as reduce the variation in dynamic range due to manufacturing variation of transistors.

The photoelectric conversion devices according to ninth to eleventh embodiments can be manufactured together with shift resistors, which act as a scanning circuit, in a CMOS manufacturing process, although the devices use photodiodes; therefore, by improving the dynamic range and linearity of the photoelectric conversion devices, and reducing variation in dynamic range of the photoelectric conversion devices, it is possible to generally use the photoelectric conversion devices as so-called CMOS sensors.

The present invention is not limited to the above embodiments and various changes and modifications can be made within the spirit and scope of the present invention. Therefore to apprise the public of the scope of the present invention, the following claims are made.

What is claimed is:

1. A photoelectric conversion device having a plurality of pixel cells each of which includes a photoelectric conversion element, a field effect transistor having a gate area for storing signal charge generated by said photoelectric conversion element and a source-drain path for outputting a signal corresponding to the signal charge stored in the gate, a first power supply line for supplying electric power to said field effect transistor, and a first switch connected between said field effect transistor and said first power supply line, wherein, when a reset voltage for resetting the gate of said field effect transistor is $V_{sig0}$, a threshold voltage of said field effect transistor is $V_{th}$, current flowing through said field effect transistor is $I_a$, a voltage applied via said first power supply line is $V_{c1}$, and a series resistance of said first switch is $R_{on}$, each pixel cell satisfies a condition determined by $$V_{c1} - R_{on} \times I_a > V_{sig0} - V_{th}, \text{ and}$$

each of said pixel cells further comprises a second switch for resetting said gate area of said field effect transistor, and said first switch and said second switch are field effect transistors having different threshold voltages from each other.

2. The photoelectric conversion device according to claim 1, wherein said first switch and said second switch have channel regions and wherein said first and second switches are made to have different threshold voltages by making said channel regions of said first switch and said second switch have different impurity concentrations from each other.

3. The photoelectric conversion device according to claim 1, wherein said first switch and said second switch have well regions and wherein said first switch and said second switch are made to have different threshold voltages by making said well regions of said first and said second switch have different impurity concentrations from each other.

4. The photoelectric conversion device according to claim 1, wherein said first switch and said second switch have gate dielectric films and wherein said first switch and said second switch are made to have different threshold voltages by making said gate dielectric films of said first switch and said second switch have different thickness from each other.

5. The photoelectric conversion device according to claim 1, wherein said first switch and said second switch have gate dielectric films and wherein said first switch and said second switch are made to have different threshold voltages by making said gate dielectric films of said first switch and said second switch with different materials having different dielectric constants from each other.

6. The photoelectric conversion device according to claim 1, wherein said first switch and said second switch are formed on different well regions which are isolated from each other, and said first switch and said second switch are made to have different threshold voltages by applying different voltages to said respective well regions.

7. The photoelectric conversion device according to claim 1, wherein said first switch and said second switch are insulated-gate field effect transistors, and said first switch and said second switch are made to have different threshold voltages by making said first switch and said second switch have different gate lengths from each other.

8. The photoelectric conversion device according to claim 1, wherein said first switch and said second switch are insulated-gate field effect transistors, and said first switch and said second switch are made to have different threshold voltages by making said first switch and said second switch have different gate widths from each other.

9. A photoelectric conversion device having a plurality of pixel cells each of which includes a photoelectric conversion element, a field effect transistor having a gate area for storing charge generated by said photoelectric conversion element and a source-drain path for outputting a signal corresponding to the signal charge stored in the gate, a first power supply line for supplying electric power to said field effect transistor, and a first switch connected between said field effect transistor and said first power supply line, wherein, when a reset voltage for resetting the gate of said field effect transistor is $V_{sig0}$, a threshold voltage of said field effect transistor is $V_{th}$, current flowing through said field effect transistor is $I_a$, a voltage applied via said first power supply line is $V_{c1}$, and a series resistance of said first switch is $R_{on}$, each pixel cell satisfies a condition determined by $$V_{c1} - R_{on} \times I_a > V_{sig0} - V_{th}, \text{ and}$$

each of said pixel cells further comprises a second switch for resetting said gate area of said field effect transistor and a capacitor formed between said second switch and the gate area of said field effect transistor, and the gate voltage of said field effect transistor is controlled via said capacitor.

10. A photoelectric conversion device having a plurality of pixel cells each of which includes a photoelectric conversion element, a field effect transistor having a gate area for storing signal charge generated by said photoelectric conversion element and a source-drain path for outputting a signal corresponding to the signal charge stored in the gate, a first power supply line for supplying electric power to said field effect transistor, and a first switch connected between said field effect transistor and said first power supply line, wherein, when a reset voltage for resetting the gate of said field effect transistor is $V_{sig0}$, a threshold voltage of said field effect transistor is $V_{th}$, current flowing through said field effect transistor is $I_a$, a voltage applied via said first power supply line is $V_{c1}$, and a series resistance of said first switch is $R_{on}$, each pixel cell satisfies a condition determined by $$V_{c1} - R_{on} \times I_a > V_{sig0} - V_{th}, \text{ and}$$

each of said pixel cells further comprises a second switch for resetting said gate area of said field effect transistor and a third switch connected between said photoelectric conversion element and an intersection of said second switch and the gate area of said field effect transistor, and the gate area of said field effect transistor has a lower capacitance than does said photoelectric conversion element.

11. A photoelectric conversion device having a plurality of pixel cells each of which includes a photoelectric conversion element, a field effect transistor having a gate area for storing signal charge generated by said photoelectric conversion element and a source-drain path for outputting a signal corresponding to the signal charge stored in the gate, a first power supply line for supplying electric power to said field effect transistor, and a first switch connected between said field effect transistor and said first power supply line, wherein, when a reset voltage for resetting the gate of said field effect transistor is $V_{sig0}$, a threshold voltage of said field effect transistor is $V_{th}$, current flowing through said field effect transistor is $I_a$, a voltage applied via said first power supply line is $V_{c1}$, and series resistance of said first switch is $R_{on}$, each pixel cell satisfies a condition determined by $$V_{c1} - R_{on} \times I_a > V_{sig0} - V_{th},$$

each of said pixel cells further comprises a second switch for resetting said gate area of said field effect transistor, and said first switch and said second switch are field effect transistor, and, when mobility is $\mu$, capacitance of gate oxide per unit area is Cox, gate width is W, and gate length is L in said first switch, and $K = 1/2 \times \mu \times Cox \times W/L$, a threshold voltage of said second switch is $V_{th0}$, a threshold voltage of said first switch is $V_{th1}$, the gate voltage of said second switch is V2, and the gate voltage of said first switch is V3, then each pixel cell satisfies a condition determined by $$V3 - V_{th1} - (I_a/K)^{1/2} > V2 - V_{th0} - V_{th}, \text{ and}$$

the gate voltage V2 of said second switch and the gate voltage V3 of said first switch are controlled to be equal, and the threshold voltage $V_{th}$ of said field effect transistor, the threshold voltage $V_{th0}$ of said second switch and the threshold voltage $V_{th1}$ of said first switch are set to be equal.

* * * * *

UNITED STATES PATENT AND TRADEMARK OFFICE
CERTIFICATE OF CORRECTION

PATENT NO. : 6,946,637 B2
APPLICATION NO. : 10/680181
DATED : September 20, 2005
INVENTOR(S) : Tetsunobu Kochi et al.

It is certified that error appears in the above-identified patent and that said Letters Patent is hereby corrected as shown below:

Title page,
Item [75], Inventors, "Tetsunobu Kochi, Kanagawa-ken (JP); Shigetoshi Sugawa, Kanagawa-ken (JP): Isamu Ueno, Kanagawa-ken (JP); Katsuhisa Ogawa, Tokyo (JP); Toru Koizumi, Kanagawa-ken (JP); Katsuhito Sakurai, Tokyo (JP); Hiroki Hiyama, Kanagawa-ken (JP)" should read -- Tetsunobu Kochi, Hiratsuka (JP); Shigetoshi Sugawa, Atsugi (JP); Isamu Ueno, Hadano (JP); Katsuhisa Ogawa, Machida (JP); Toru Koizumi, Yokohama (JP); Katsuhito Sakurai, Machida (JP); Hiroki Hiyama, Atsugi (JP) --.

Column 1,
Line 23, "provide" should read -- provides --.

Column 2,
Line 40, "is" should read -- are --.

Column 8,
Line 7, "Vth1," should read -- $V_{th1}$, --.

Column 11,
Line 55, "denotes are" should read -- denote --.

Column 12,
Line 8, "are" should read -- is --; and
Line 36, "phenomena" should read -- phenomenon --.

Column 15,
Line 18, "manner that" should read -- manner as that --; and
Line 23, "that" should read -- as that --.

Column 17,
Line 56, "are" should read -- is --; and
Line 57, "photo-charge" should read -- photo-charges --.

Column 18,
Line 55, "regist" should read -- resist --.

Column 19,
Line 57, "first and" should read -- first switch and --; and
Line 64, "thickness" should read -- thicknesses --.

UNITED STATES PATENT AND TRADEMARK OFFICE
CERTIFICATE OF CORRECTION

PATENT NO. : 6,946,637 B2
APPLICATION NO. : 10/680181
DATED : September 20, 2005
INVENTOR(S) : Tetsunobu Kochi et al.

It is certified that error appears in the above-identified patent and that said Letters Patent is hereby corrected as shown below:

Column 20,
Line 26, "charge" should read -- signal charge --.

Column 22,
Line 4, "transistor," should read -- transistors, --.

Signed and Sealed this

Twenty-seventh Day of June, 2006

JON W. DUDAS
*Director of the United States Patent and Trademark Office*